US012063782B2

(12) United States Patent
Hopkins et al.

(10) Patent No.: US 12,063,782 B2
(45) Date of Patent: Aug. 13, 2024

(54) INTEGRATED ASSEMBLIES HAVING METAL-CONTAINING LINERS ALONG BOTTOMS OF TRENCHES, AND METHODS OF FORMING INTEGRATED ASSEMBLIES

(71) Applicant: Lodestar Licensing Group LLC, Evanston, IL (US)

(72) Inventors: John D. Hopkins, Meridian, ID (US); Justin D. Shepherdson, Meridian, ID (US); Collin Howder, Meridian, ID (US); Jordan D. Greenlee, Boise, ID (US)

( * ) Notice: Subject to any disclaimer, the term of this patent is extended or adjusted under 35 U.S.C. 154(b) by 0 days.

(21) Appl. No.: 17/941,900

(22) Filed: Sep. 9, 2022

(65) Prior Publication Data

US 2023/0005956 A1 Jan. 5, 2023

Related U.S. Application Data

(62) Division of application No. 16/445,065, filed on Jun. 18, 2019, now Pat. No. 11,538,822.

(51) Int. Cl.
| | |
|---|---|
| *H10B 43/27* | (2023.01) |
| *H01L 21/02* | (2006.01) |
| *H01L 21/28* | (2006.01) |
| *H01L 21/285* | (2006.01) |
| *H01L 21/311* | (2006.01) |
| *H01L 29/66* | (2006.01) |
| *H10B 41/10* | (2023.01) |

(Continued)

(52) U.S. Cl.
CPC ....... *H10B 43/27* (2023.02); *H01L 21/02164* (2013.01); *H01L 21/0217* (2013.01); *H01L 21/02532* (2013.01); *H01L 21/28518* (2013.01); *H01L 21/31111* (2013.01); *H01L 29/40114* (2019.08); *H01L 29/40117* (2019.08); *H01L 29/66545* (2013.01); *H10B 41/10* (2023.02); *H10B 41/27* (2023.02); *H10B 43/10* (2023.02)

(58) Field of Classification Search
CPC ........ H10B 41/27; H10B 43/27; H10B 41/35; H10B 41/41
See application file for complete search history.

(56) References Cited

U.S. PATENT DOCUMENTS

| | | | | |
|---|---|---|---|---|
| 9,356,034 B1 * | 5/2016 | Yada | ...................... | H10B 41/27 |
| 9,543,318 B1 * | 1/2017 | Lu | ........................... | H10B 43/27 |
| 9,646,981 B2 * | 5/2017 | Nishikawa | .............. | H01L 28/20 |

(Continued)

FOREIGN PATENT DOCUMENTS

| | | | |
|---|---|---|---|
| WO | WO 2019/172972 | 9/2019 | |
| WO | WO-2019172972 A1 * | 9/2019 | ........... H01L 21/022 |

*Primary Examiner* — Edward Chin
(74) *Attorney, Agent, or Firm* — Brooks, Cameron & Huebsch, PLLC

(57) ABSTRACT

Some embodiments include methods of forming integrated assemblies. A conductive structure is formed to include a semiconductor-containing material over a metal-containing material. An opening is formed to extend into the conductive structure. A conductive material is formed along a bottom of the opening. A stack of alternating first and second materials is formed over the conductive structure either before or after forming the conductive material. Insulative material and/or channel material is formed to extend through the stack to contact the conductive material. Some embodiments include integrated assemblies.

13 Claims, 35 Drawing Sheets

(51) Int. Cl.
*H10B 41/27* (2023.01)
*H10B 43/10* (2023.01)

(56) References Cited

U.S. PATENT DOCUMENTS

| | | | |
|---|---|---|---|
| 10,103,169 B1* | 10/2018 | Ge | H10B 43/10 |
| 10,256,167 B1* | 4/2019 | Fukuo | H01L 21/765 |
| 10,355,009 B1 | 7/2019 | Kai et al. | |
| 2009/0180324 A1* | 7/2009 | Ramaswamy | H10B 43/35 |
| | | | 438/129 |
| 2016/0276359 A1* | 9/2016 | Oginoe | H01L 29/7889 |
| 2017/0148810 A1* | 5/2017 | Kai | H01L 23/535 |
| 2017/0148811 A1* | 5/2017 | Zhang | H01L 21/76802 |
| 2017/0365487 A1* | 12/2017 | Shen | H01L 21/30604 |
| 2018/0366487 A1* | 12/2018 | Okizumi | H10B 43/50 |
| 2019/0013327 A1* | 1/2019 | He | H10B 43/20 |
| 2019/0035807 A1* | 1/2019 | Kim | H10B 43/27 |
| 2019/0067314 A1* | 2/2019 | Lu | H01L 24/05 |
| 2019/0214230 A1* | 7/2019 | Cui | H01L 21/32135 |
| 2022/0231048 A1* | 7/2022 | Sharangpani | H10B 41/10 |

* cited by examiner

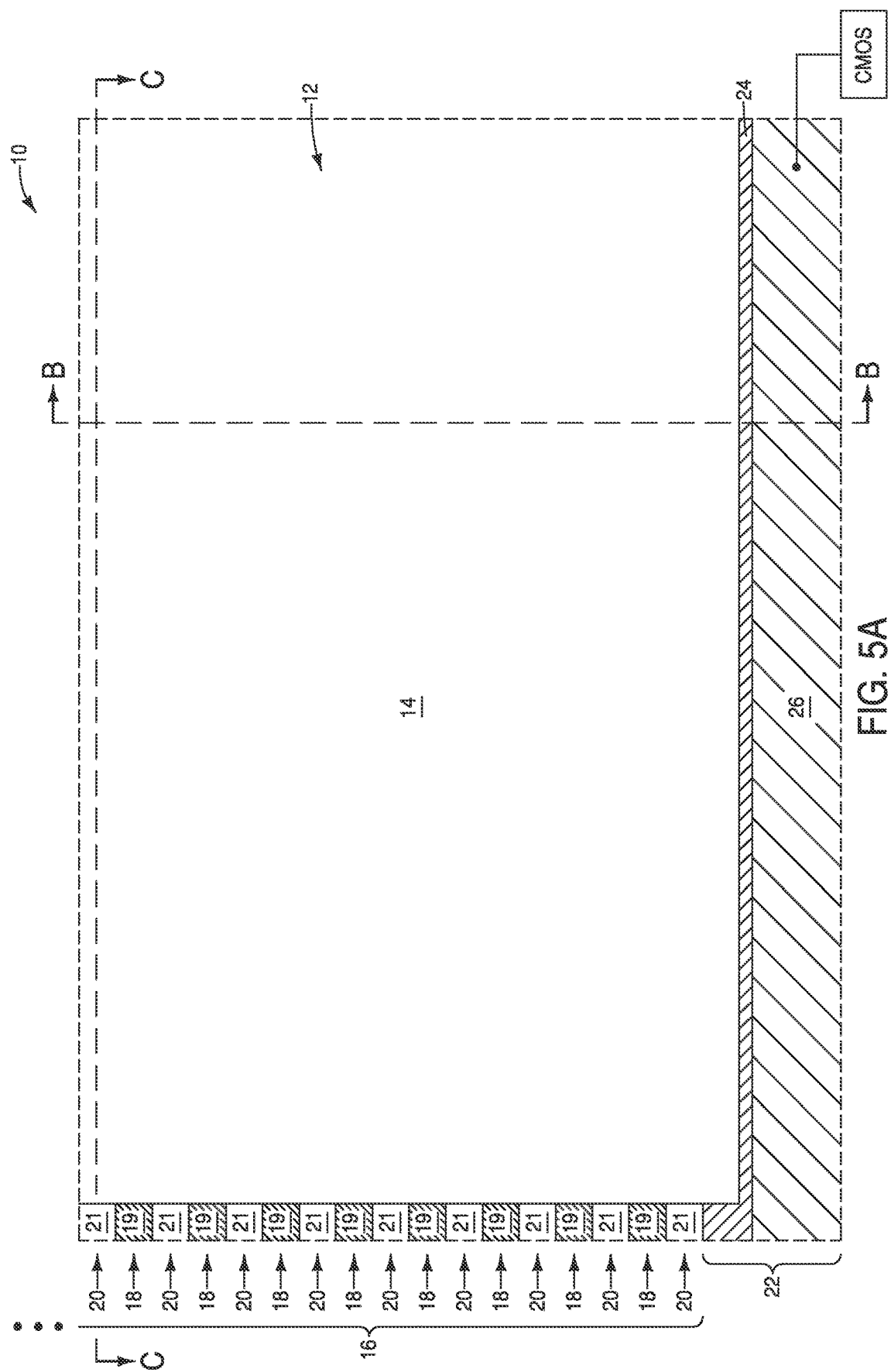

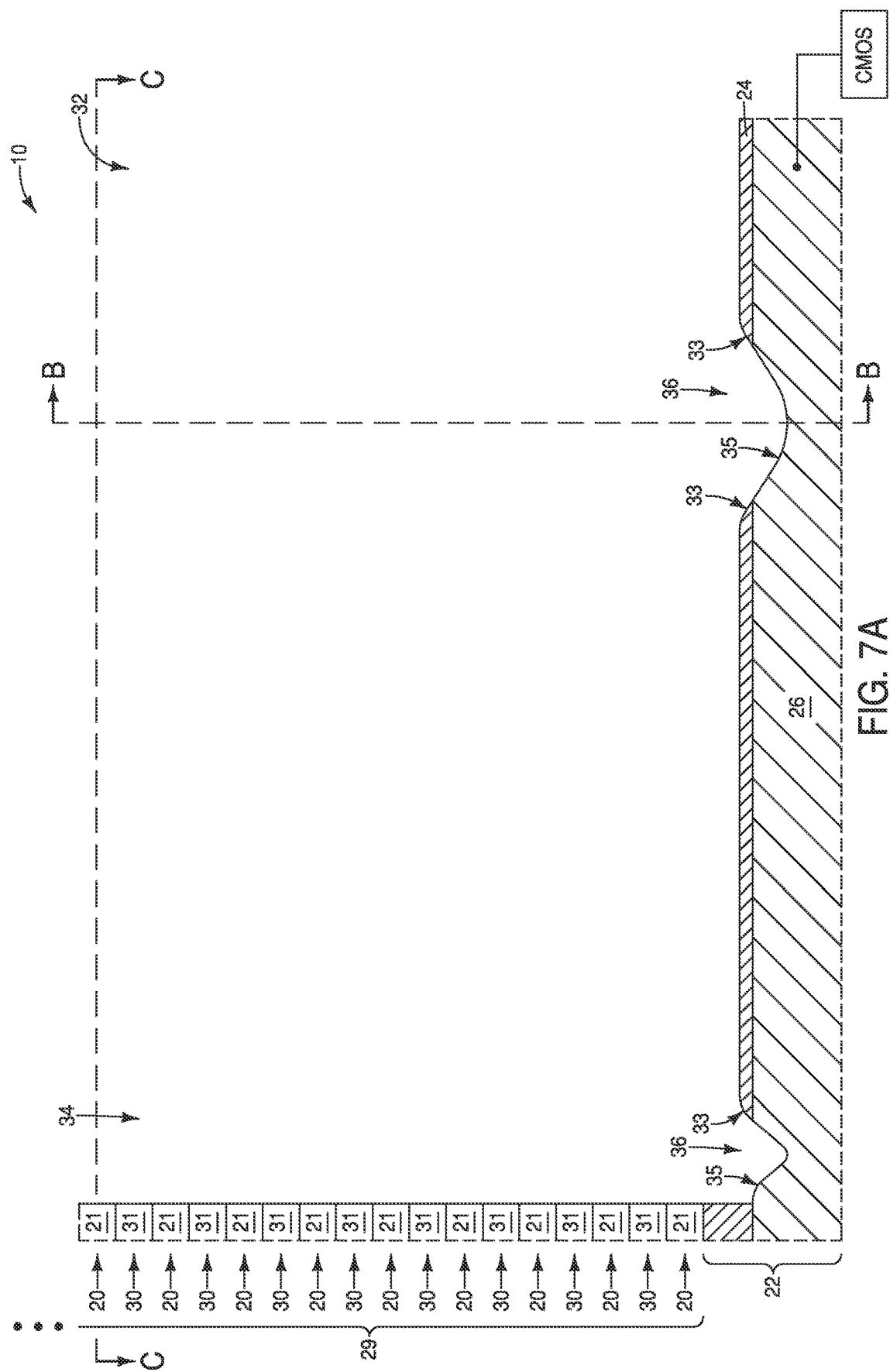

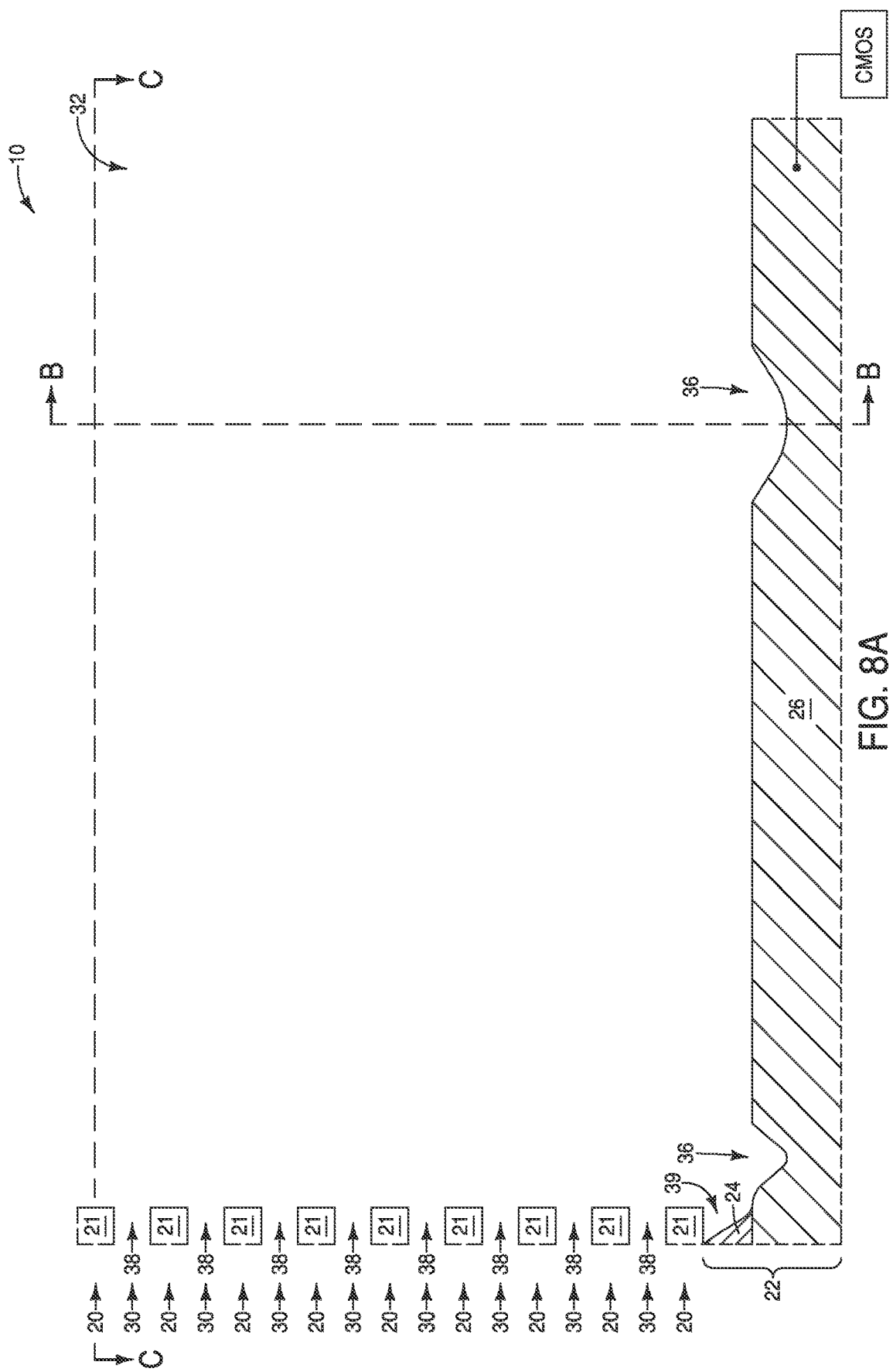

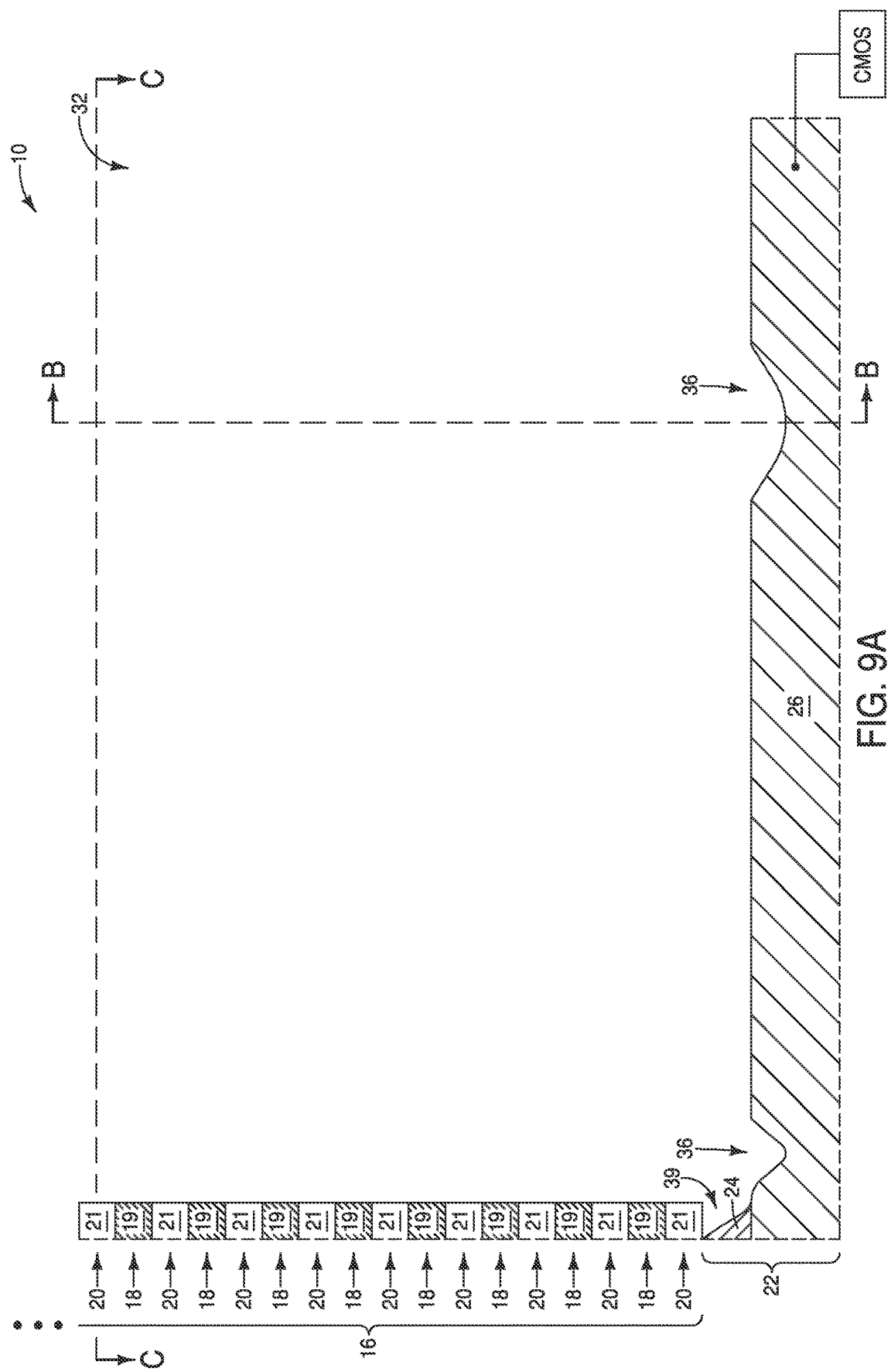

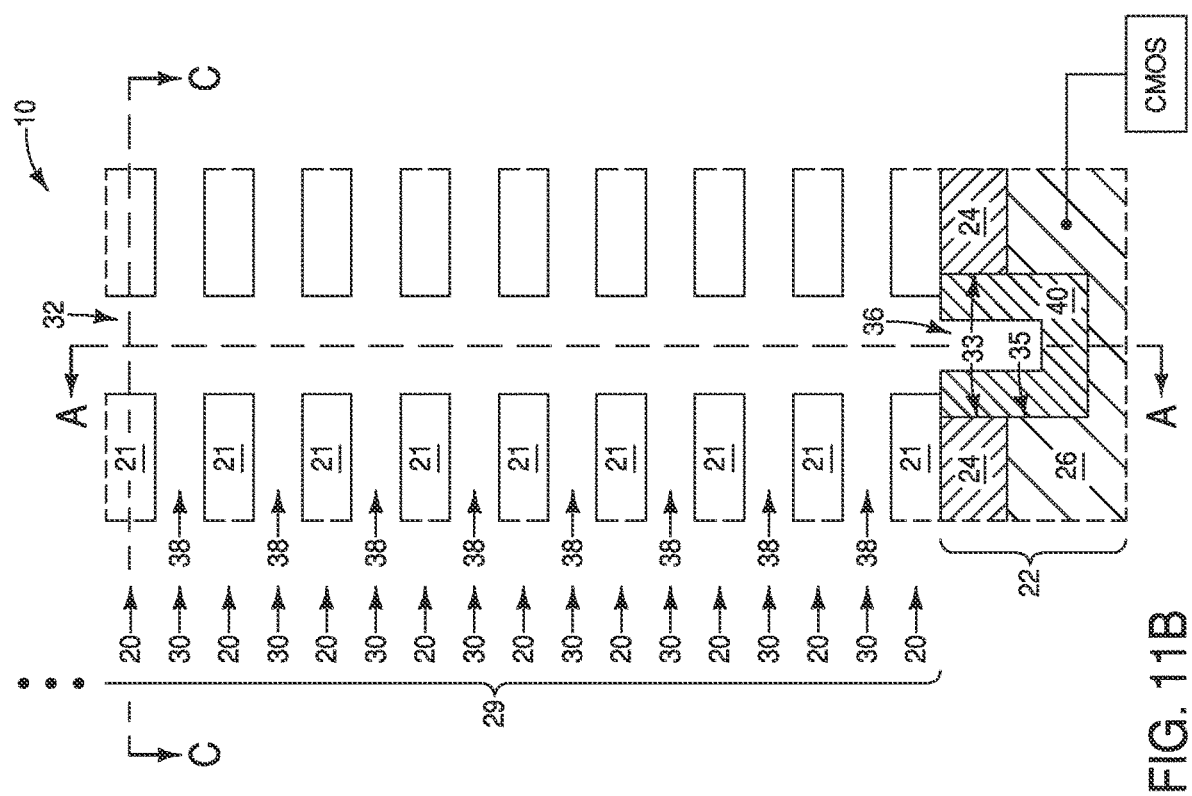

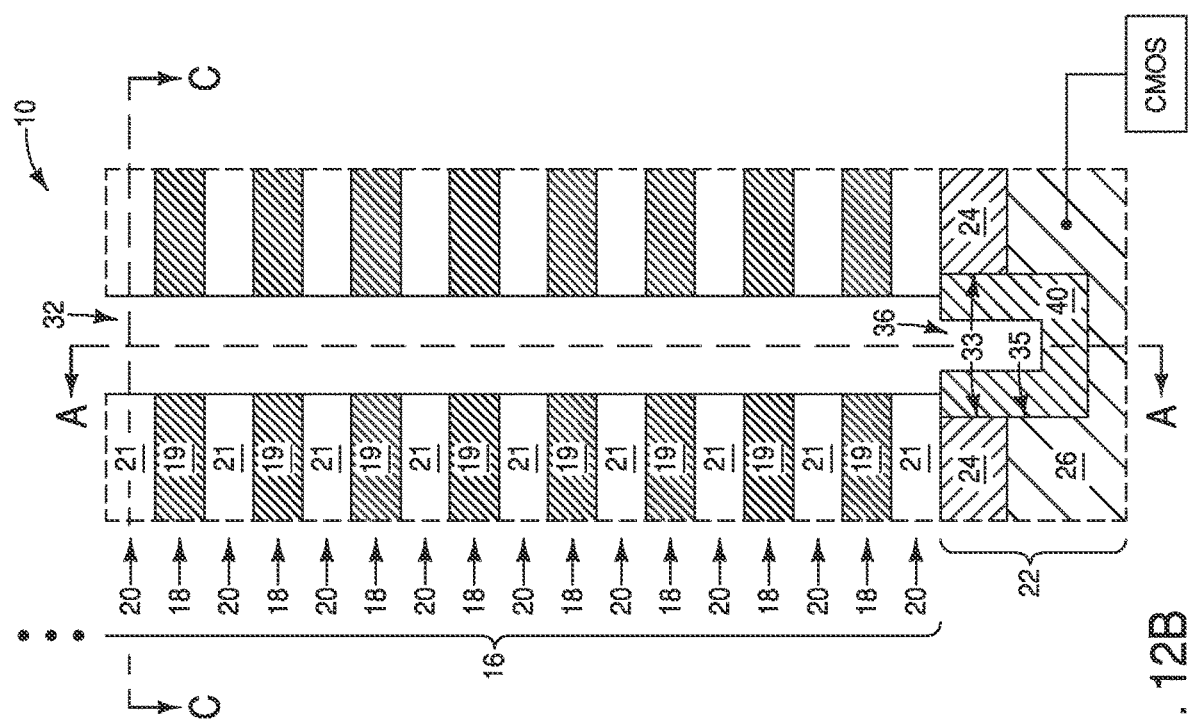

US 12,063,782 B2

INTEGRATED ASSEMBLIES HAVING METAL-CONTAINING LINERS ALONG BOTTOMS OF TRENCHES, AND METHODS OF FORMING INTEGRATED ASSEMBLIES

RELATED PATENT DATA

This patent is a divisional of and claims priority to U.S. patent application Ser. No. 16/445,065, filed Jun. 18, 2019, the disclosures of which are incorporated herein by reference.

TECHNICAL FIELD

Integrated assemblies (e.g., three-dimensional NAND) having metal-containing liners along bottoms of trenches, and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

BRIEF DESCRIPTION OF THE DRAWINGS

FIG. 5 is a diagrammatic top-down cross-sectional view along the lines C-C of FIGS. 5A and 5B. FIGS. 5A and 5B are diagrammatic cross-sectional side views along the lines A-A and B-B, respectively, of FIG. 5. The cross-sectional view of FIG. 5A is also along the line A-A of FIG. 5B, and the cross-sectional view of FIG. 5B is also along the line B-B of FIG. 5A.

FIG. 6 is a diagrammatic top-down cross-sectional view along the lines C-C of FIGS. 6A and 6B.

FIGS. 6A and 6B are diagrammatic cross-sectional side views along the lines A-A and B-B, respectively, of FIG. 6. The cross-sectional view of FIG. 6A is also along the line A-A of FIG. 6B, and the cross-sectional view of FIG. 6B is also along the line B-B of FIG. 6A.

FIG. 7 is a diagrammatic top-down cross-sectional view along the lines C-C of FIGS. 7A and 7B. FIGS. 7A and 7B are diagrammatic cross-sectional side views along the lines A-A and B-B, respectively, of FIG. 7. The cross-sectional view of FIG. 7A is also along the line A-A of FIG. 7B, and the cross-sectional view of FIG. 7B is also along the line B-B of FIG. 7A.

FIG. 8 is a diagrammatic top-down cross-sectional view along the lines C-C of FIGS. 8A and 8B.

FIGS. 8A and 8B are diagrammatic cross-sectional side views along the lines A-A and B-B, respectively, of FIG. 8. The cross-sectional view of FIG. 8A is also along the line A-A of FIG. 8B, and the cross-sectional view of FIG. 8B is also along the line B-B of FIG. 8A.

FIG. 9 is a diagrammatic top-down cross-sectional view along the lines C-C of FIGS. 9A and 9B.

FIGS. 9A and 9B are diagrammatic cross-sectional side views along the lines A-A and B-B, respectively, of FIG. 9. The cross-sectional view of FIG. 9A is also along the line A-A of FIG. 9B, and the cross-sectional view of FIG. 9B is also along the line B-B of FIG. 9A.

FIG. 10 is a diagrammatic top-down cross-sectional view along the lines C-C of FIGS. 10A and 10B.

FIGS. 10A and 10B are diagrammatic cross-sectional side views along the lines A-A and B-B, respectively, of FIG. 10. The cross-sectional view of FIG. 10A is also along the line A-A of FIG. 10B, and the cross-sectional view of FIG. 10B is also along the line B-B of FIG. 10A.

FIGS. 11-11B are views of the region of the integrated assembly of FIGS. 6-6B at an example process stage subsequent to the process stage of FIGS. 10-10B. FIG. 11 is a diagrammatic top-down cross-sectional view along the lines C-C of FIGS. 11A and 11B.

FIGS. 11A and 11B are diagrammatic cross-sectional side views along the lines A-A and B-B, respectively, of FIG. 11. The cross-sectional view of FIG. 11A is also along the line A-A of FIG. 11B, and the cross-sectional view of FIG. 11B is also along the line B-B of FIG. 11A.

FIGS. 12-12B are views of the region of the integrated assembly of FIGS. 6-6B at an example process stage subsequent to the process stage of FIGS. 11-11B. FIG. 12 is a diagrammatic top-down cross-sectional view along the lines C-C of FIGS. 12A and 12B.

FIGS. 12A and 12B are diagrammatic cross-sectional side views along the lines A-A and B-B, respectively, of FIG. 12. The cross-sectional view of FIG. 12A is also along the line A-A of FIG. 12B, and the cross-sectional view of FIG. 12B is also along the line B-B of FIG. 12A.

FIG. 13 is a diagrammatic top-down cross-sectional view along the lines C-C of FIGS. 13A and 13B.

FIGS. 13A and 13B are diagrammatic cross-sectional side views along the lines A-A and B-B, respectively, of FIG. 13. The cross-sectional view of FIG. 13A is also along the line A-A of FIG. 13B, and the cross-sectional view of FIG. 13B is also along the line B-B of FIG. 13A.

DETAILED DESCRIPTION OF THE ILLUSTRATED EMBODIMENTS

Some embodiments include recognition that a problem which may be encountered during fabrication of vertically-stacked memory (e.g., three-dimensional NAND) is unintended etching of supporting semiconductor material. Such may lead to problematic collapse of vertically-stacked structures, and may ultimately lead to device failure. Some embodiments include recognition that the problem may result from exposure of metal-containing conductive material under a region of the semiconductor material, followed by galvanic removal (corrosion) of the semiconductor material during subsequent processing. Some embodiments also include recognition that the problem may be alleviated by providing liners along the bottoms of openings (e.g., trenches) to alleviate the problematic galvanic corrosion. Some embodiments include recognition that it may be advantageous to form a conductive liner between NAND channel material and NAND source structure to improve conductivity along a connection from the NAND source structure to the NAND channel material. Example embodiments are described with reference to FIGS. 5-19.

Figure 1:
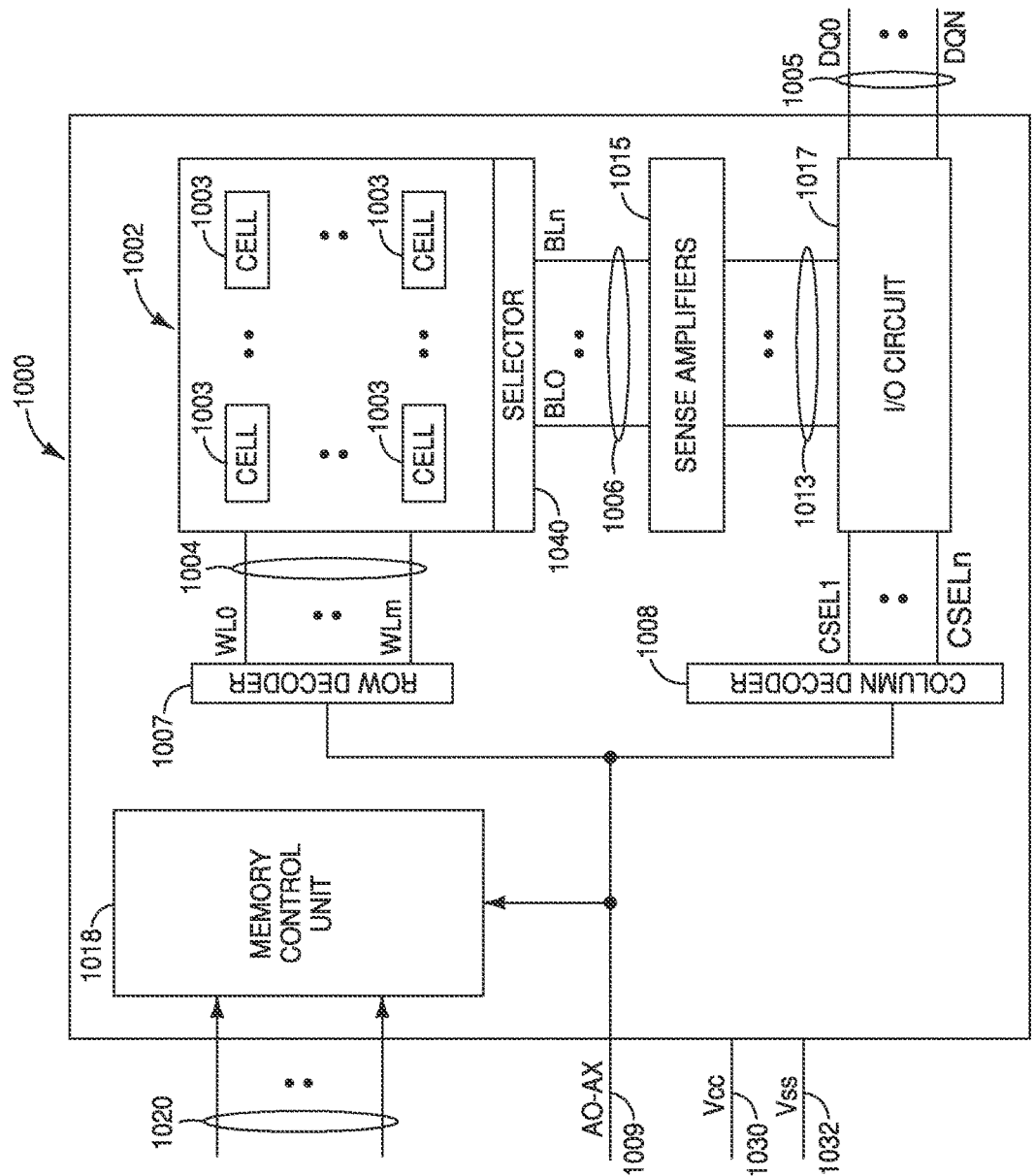
FIG. 1 shows a block diagram of a prior art memory device having a memory array with memory cells.
Figure 2:
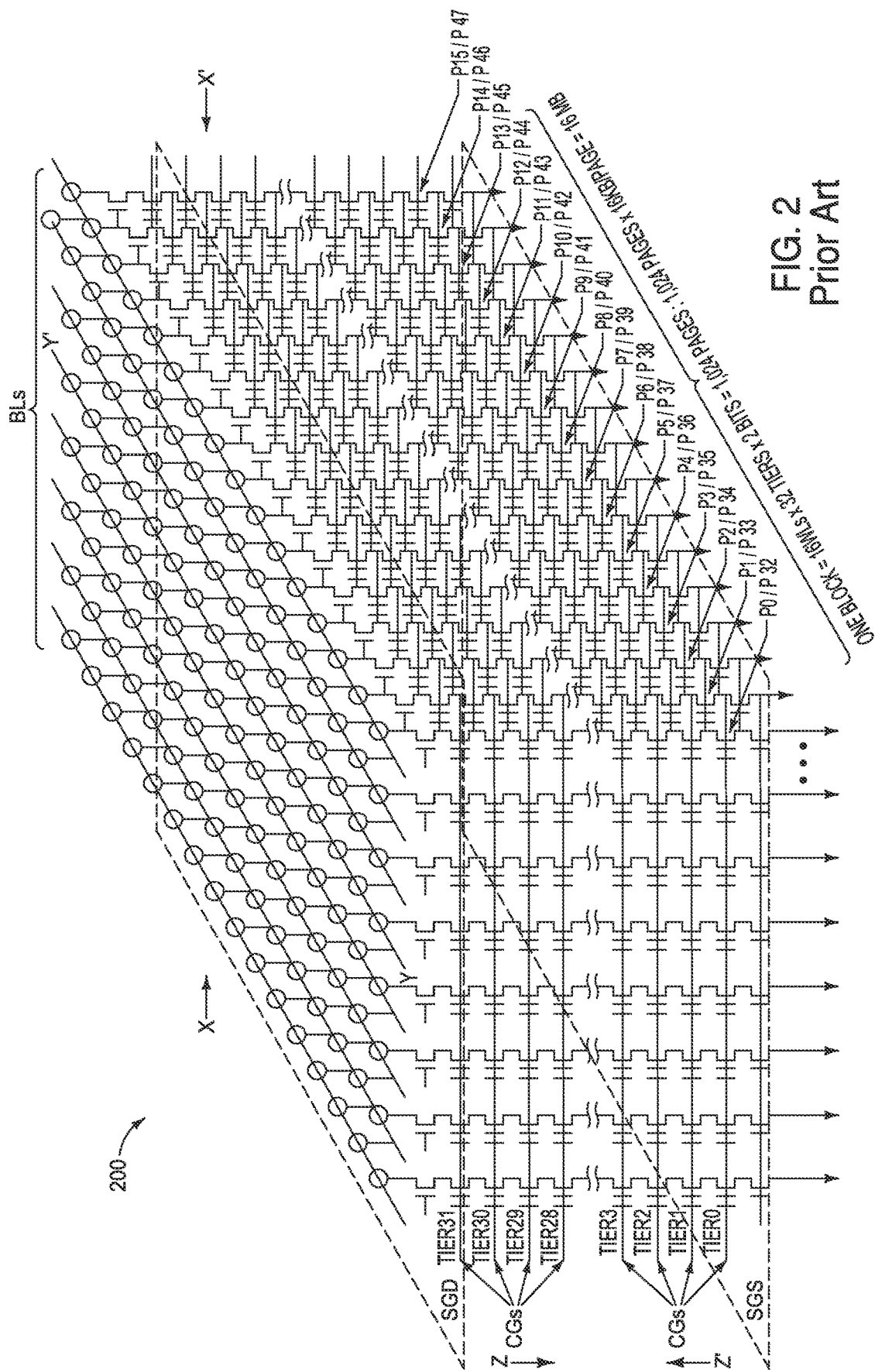
FIG. 2 shows a schematic diagram of the prior art memory array of FIG. 1 in the form of a 3D NAND memory device.
Figure 3:
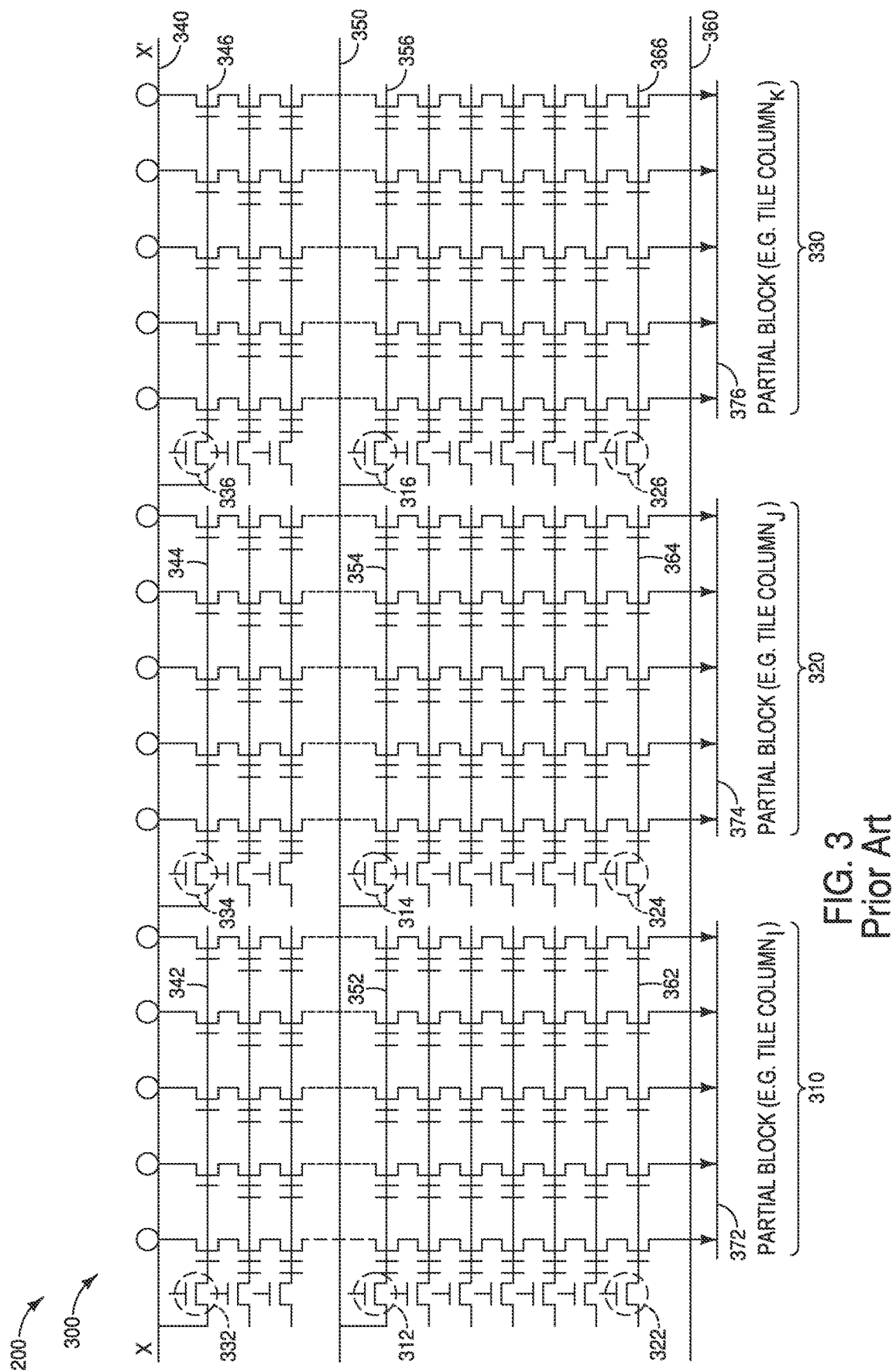
FIG. 3 shows a cross-sectional view of the prior art 3D NAND memory device of FIG. 2 in an X-X' direction.
Figure 4:
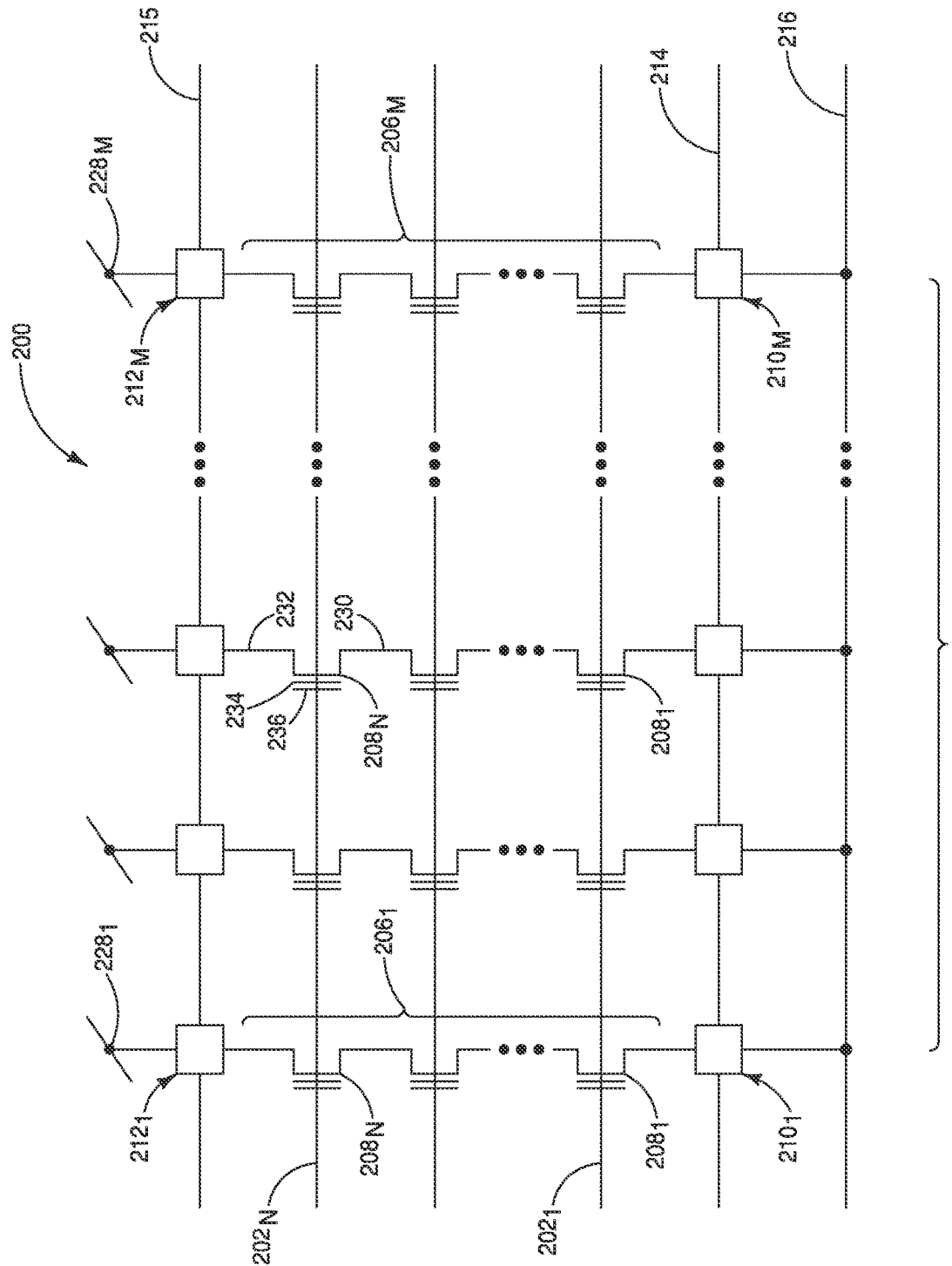
FIG. 4 is a schematic diagram of a prior art NAND memory array.
Figure 5:
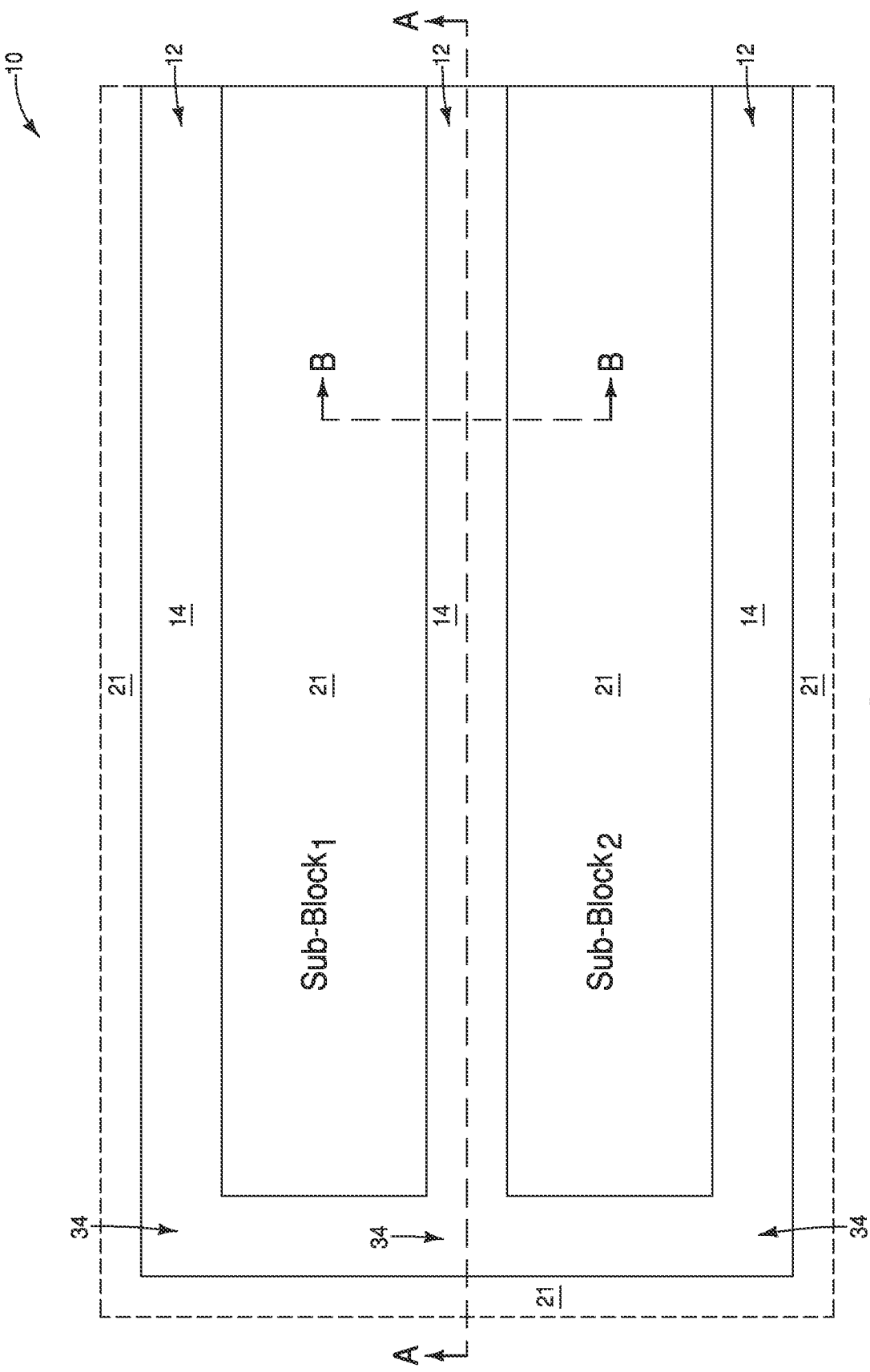
FIGS. 5-5B are views of a region of an integrated assembly illustrating an example architecture.
Figure 5B:
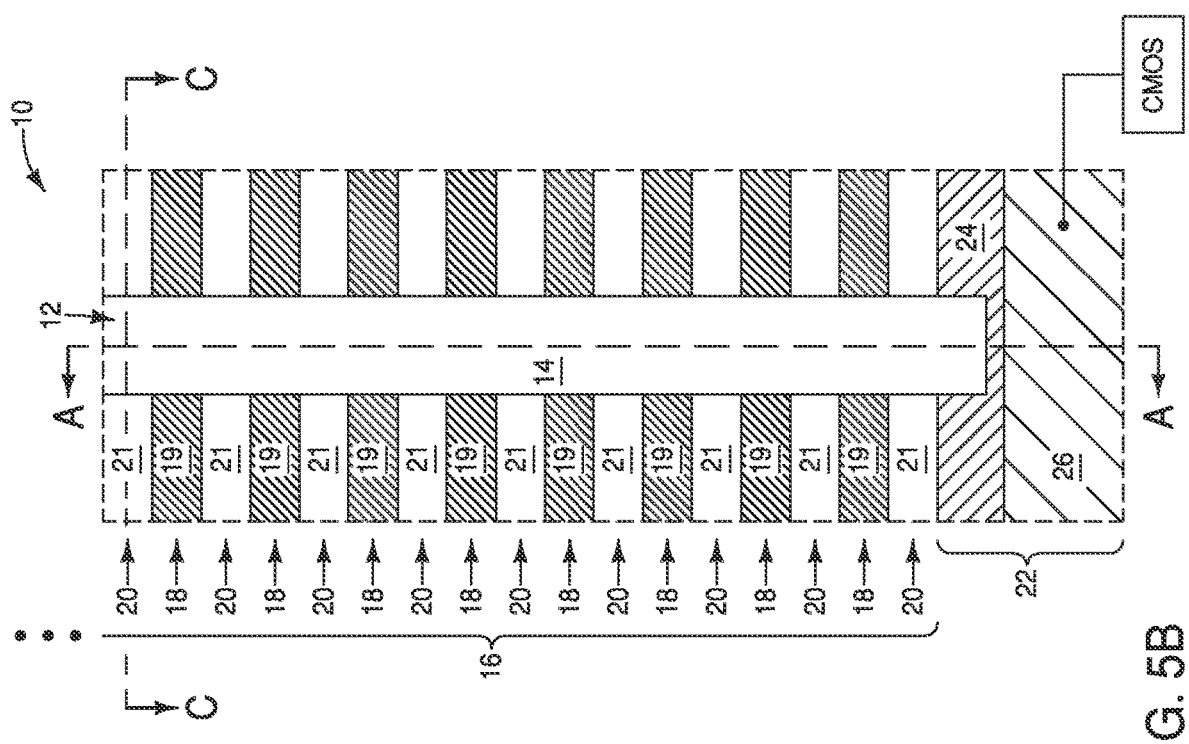

Referring to FIGS. 5-5B, regions of an example integrated assembly 10 are illustrated. The assembly includes a block region which is subdivided amongst a pair of sub-blocks (labeled "Sub-block$_1$" and "Sub-block$_2$"). The sub-blocks may be arranged in configurations suitable for three-dimensional NAND architecture, such as, for example, architectures of the types described above in FIGS. 1-4.

A partition (panel) 12 extends around the sub-blocks, and separates the sub-blocks from one another. The partition 12 comprises a partition material 14. The partition material 14 may be an insulative material, and may comprise any suitable composition(s). In some embodiments, the partition material 14 may comprise, consist essentially of, or consist of silicon dioxide.

The cross-sectional views of FIGS. 5A and 5B show that the assembly 10 includes a stack 16 of alternating conductive levels 18 and insulative levels 20. The levels 18 comprise conductive material 19, and the levels 20 comprise insulative material 21.

The conductive material 19 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 19 may include metal (e.g., tungsten) and metal nitride (e.g., tantalum nitride, titanium nitride, etc.).

The insulative material 21 may comprise any suitable composition(s); and in some embodiments may comprise, consist essentially of, or consist of silicon dioxide.

The levels 18 and 20 may be of any suitable thicknesses; and may be the same thickness as one another or different thicknesses relative to one another. In some embodiments, the levels 18 and 20 may have vertical thicknesses within a range of from about 10 nanometers (nm) to about 400 nm.

In some embodiments, the lower conductive level may be representative of a source-select-device (e.g., source-side select gate, SGS); and the upper conductive levels may be representative of wordline levels (control gate levels). The source-select-device level may or may not comprise the same conductive material(s) as the wordline levels.

Although only eight conductive levels 18 are shown in FIGS. 5A and 5B in order to simplify the drawings, in practice there may be substantially more than eight conductive levels in the stack 16 (or fewer than eight conductive levels in the stack). In some applications, the wordline levels may ultimately correspond to memory cell levels of a NAND configuration (NAND assembly). The NAND configuration will include strings of memory cells (i.e., NAND strings), with the number of memory cells in the strings being determined by the number of vertically-stacked wordline levels. The NAND strings may comprise any suitable number of memory cell levels. For instance, the NAND strings may have 8 memory cell levels, 16 and memory cell levels, 32 memory cell levels, 64 memory cell levels, 512 memory cell levels, 1024 memory cell levels, etc. Also, the source-select-device may include more than one conductive level.

The stack 16 and partition 12 are supported over a conductive structure 22. Such conductive structure comprises a semiconductor-containing material 24 over a metal-containing material 26. In the illustrated embodiment, the semiconductor-containing material 24 is directly against the metal-containing material 26.

The semiconductor-containing material 24 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor-containing material 24 may comprise, consist essentially of, or consist of conductively-doped silicon; such as, for example, n-type doped polysilicon.

The metal-containing material 26 may comprise any suitable composition(s), such as, for example, one or more of various metals (e.g., titanium, tungsten, cobalt, nickel, platinum, ruthenium, etc.) and/or metal-containing compositions (e.g., metal silicide, metal nitride, metal carbide, etc.). In some embodiments, the metal-containing material 26 may comprise, consist essentially of, or consist of $WSi_x$, where x is greater than 0.

In some embodiments, the conductive structure 22 may correspond to a source structure (e.g., a structure comprising the so-called common source line 216 of FIG. 4). The source structures of FIGS. 1-4 are referred to as "lines" in accordance with traditional nomenclature, but such lines may be comprised by an expanse rather than a simple wiring line; such as the expanse shown in FIGS. 5A and 5B as structure 22.

Vertically-stacked memory cells (not shown in FIGS. 5-5B) may be provided within the stack 16 along the conductive wordline levels. Such memory cells may be arranged in vertical NAND strings of the types described in FIGS. 1-4. The NAND strings may comprise channel material pillars which extend through the stack 16, with the channel material being electrically coupled with the semiconductor-containing material 24 of the conductive structure 22. The channel material pillars may be arranged within the sub-blocks in any suitable configuration; and in some embodiments may be in a tightly-packed arrangement, such as, for example, a hexagonally-packed arrangement.

The conductive structure 22 may be supported by a semiconductor substrate (not shown). The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The conductive structure 22 is shown to be electrically coupled with CMOS (complementary metal oxide semiconductor). The CMOS may be in any suitable location relative to the conductive structure 22, and in some embodiments may be under such conductive structure. The CMOS may comprise logic and/or other appropriate circuitry for driving the source structure 22 during operation of memory associated with the stack 16. Although the circuitry is specifically identified to be CMOS in the embodiment of FIGS. 5A and 5B, it is to be understood that such circuitry could be replaced with any other suitable circuitry in other embodiments.

FIGS. 5-5B show a desired arrangement in which the stack 16 is supported over the conductive structure 22. However, in practice it is sometimes found that the actual arrangement has a warped or broken stack. Specifically, processing utilized to form the conductive levels 18 may undesirably remove a substantial amount of the semiconductor-containing material 24 of conductive structure 22, leading to formation of voids between the stack 16 and the conductive material 26. The voids may cause partial and/or total collapse of some of the regions of the stack 16; which may detrimentally alter device performance, and which may even lead to device failure. One aspect of the invention described herein is recognition that the detrimental voids may result from galvanic corrosion of the semiconductor-containing material 24, as explained with reference to FIGS. 6-9.

Figure 6:
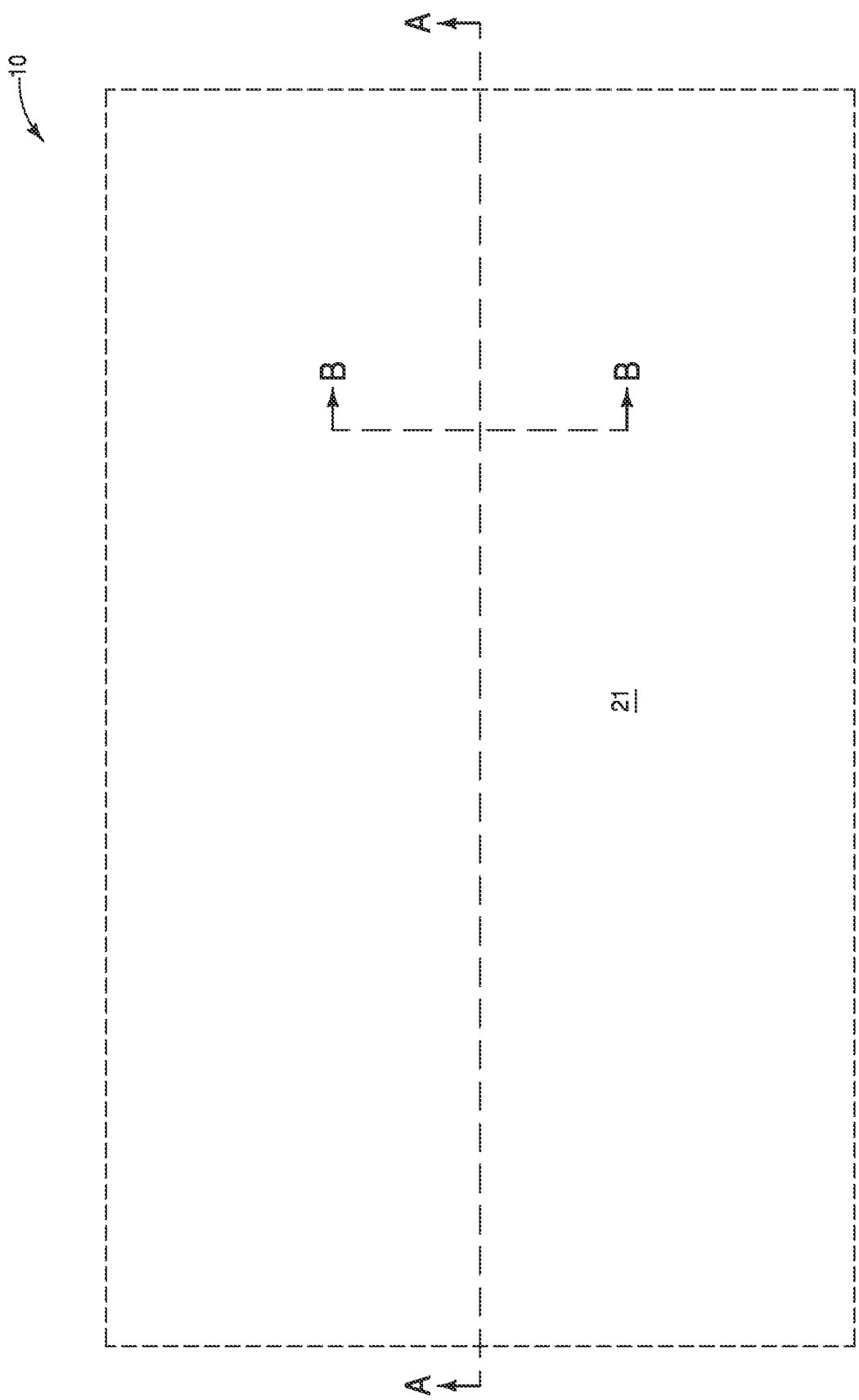
FIGS. 6-6B are views of a region of an integrated assembly at an example process stage of an example method for forming an example architecture.
Figure 6A:
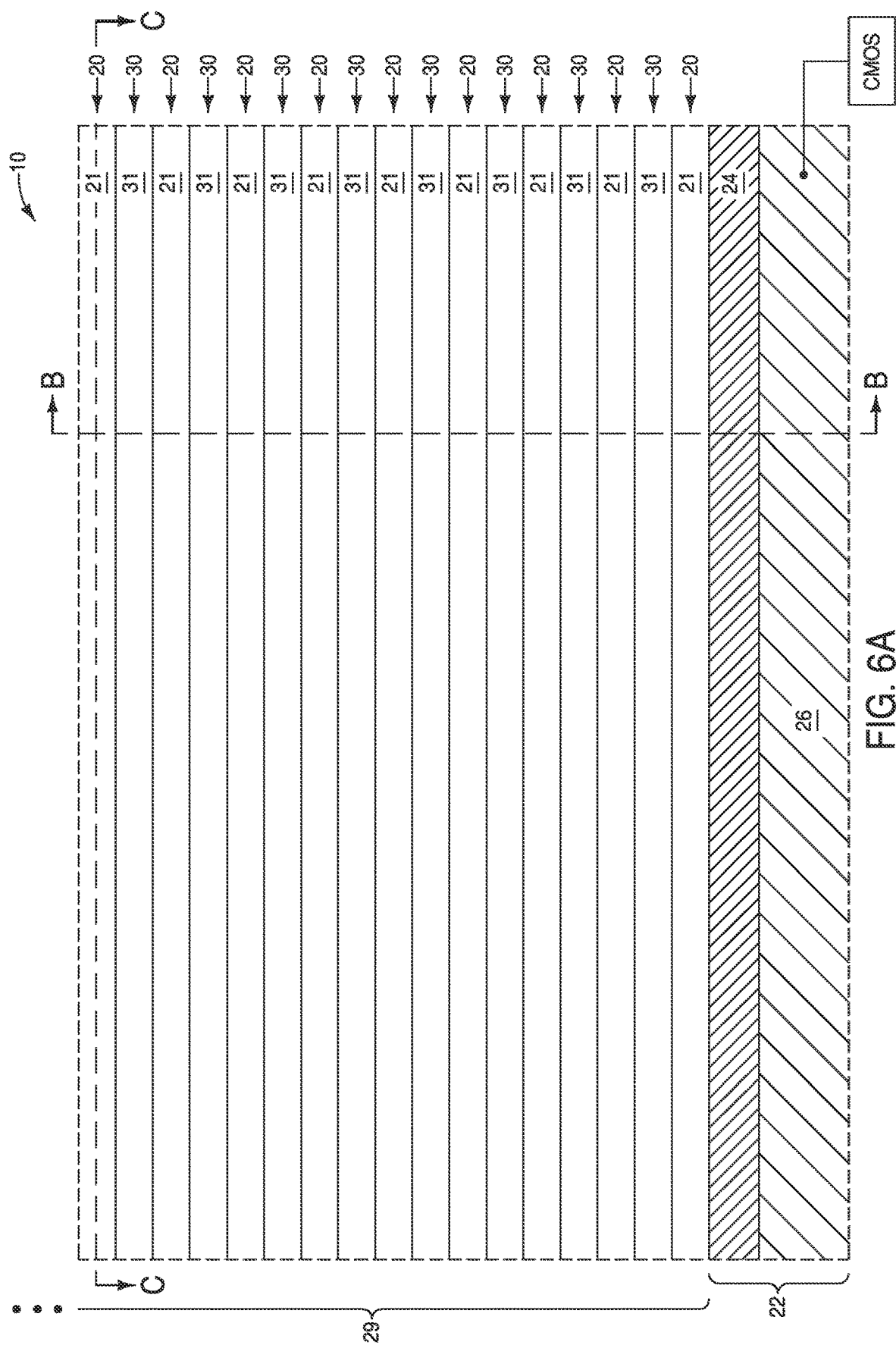
Figure 6B:
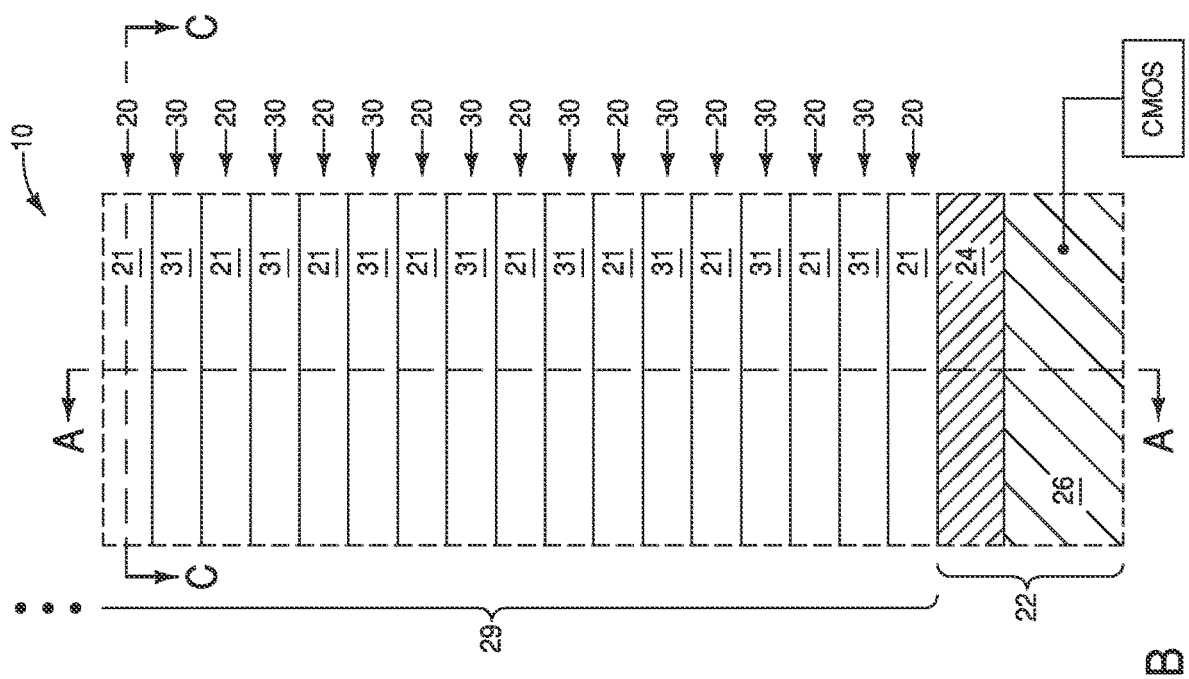

Referring to FIGS. 6-6B, a region of assembly 10 is shown at a process stage during fabrication of the conductive wordlines of stack 16 (with the conductive wordlines ultimately being within the conductive levels 18 described above with reference to FIG. 5). It was noted above in describing FIG. 5 that the upper conductive levels 18 may correspond to wordlines and the lower level(s) may correspond to one more select device levels. The processing described herein forms all of the levels 18 identically with a gate-replacement process. In other embodiments, the select device levels may not be subjected to the gate replacement processing.

The assembly 10 of FIGS. 6-6B includes a stack 29 of alternating first and second levels 30 and 20. The second levels 20 are identical to the insulative levels 20 described above with reference to FIGS. 5-5B, and comprise the insulative material 21. The first levels 30 comprise sacrificial material 31. Such sacrificial material may comprise any suitable composition(s); and in some embodiments may comprise, consist essentially of, or consist of silicon nitride. The materials 21 and 31 of the alternating levels 20 and 30 may be referred to as alternating first and second materials of the stack 29.

The stack 29 is supported over the conductive structure 22. In the illustrated embodiment, the conductive structure 22 is coupled with CMOS at the processing stage of FIGS. 6-6B. In other embodiments, the coupling to the CMOS may be provided at a subsequent process stage.

Figure 7:
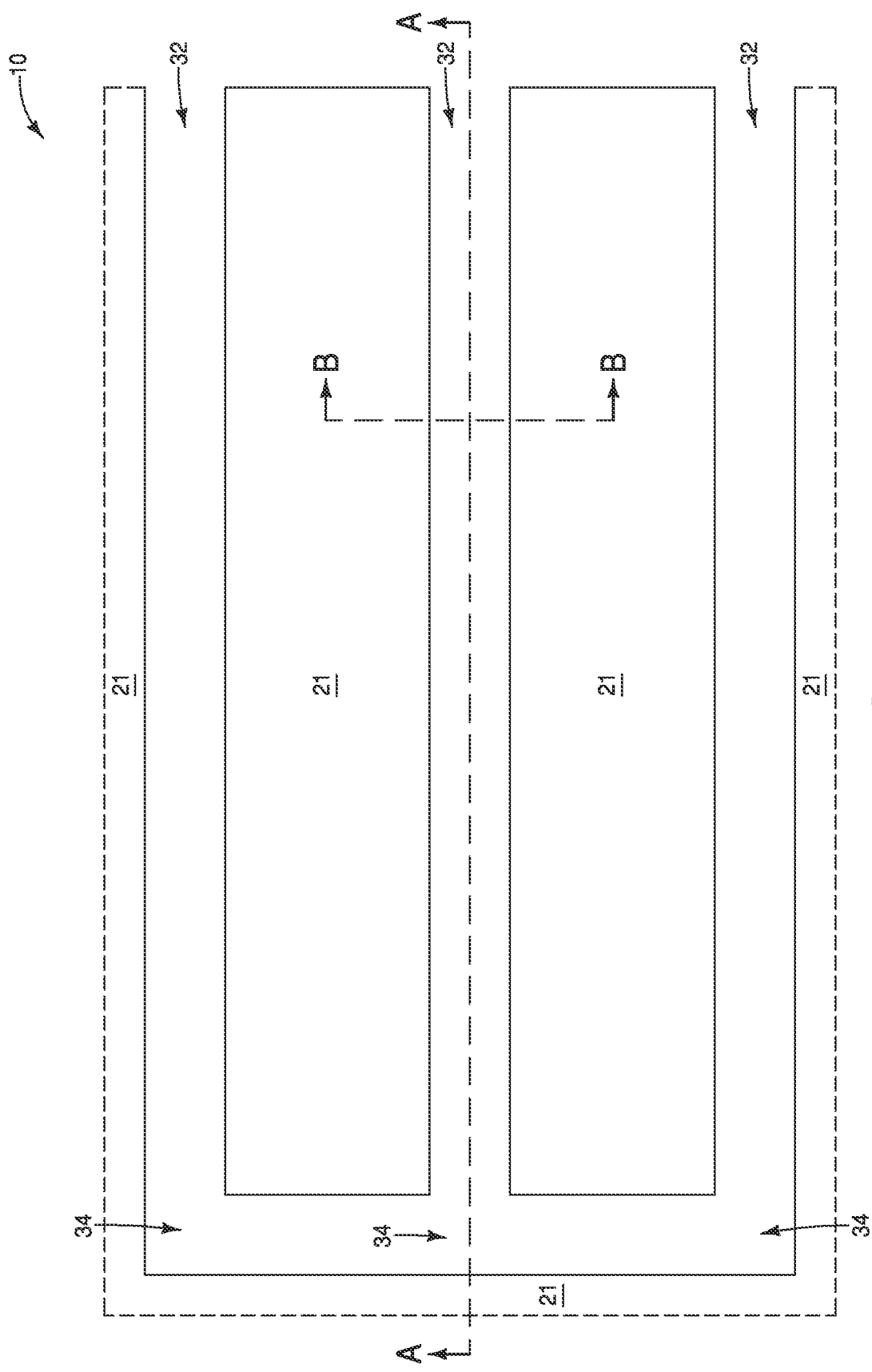
FIGS. 7-7B are views of the region of the integrated assembly of FIG. 6 at an example process stage subsequent to the process stage of FIG. 6.
Figure 7B:
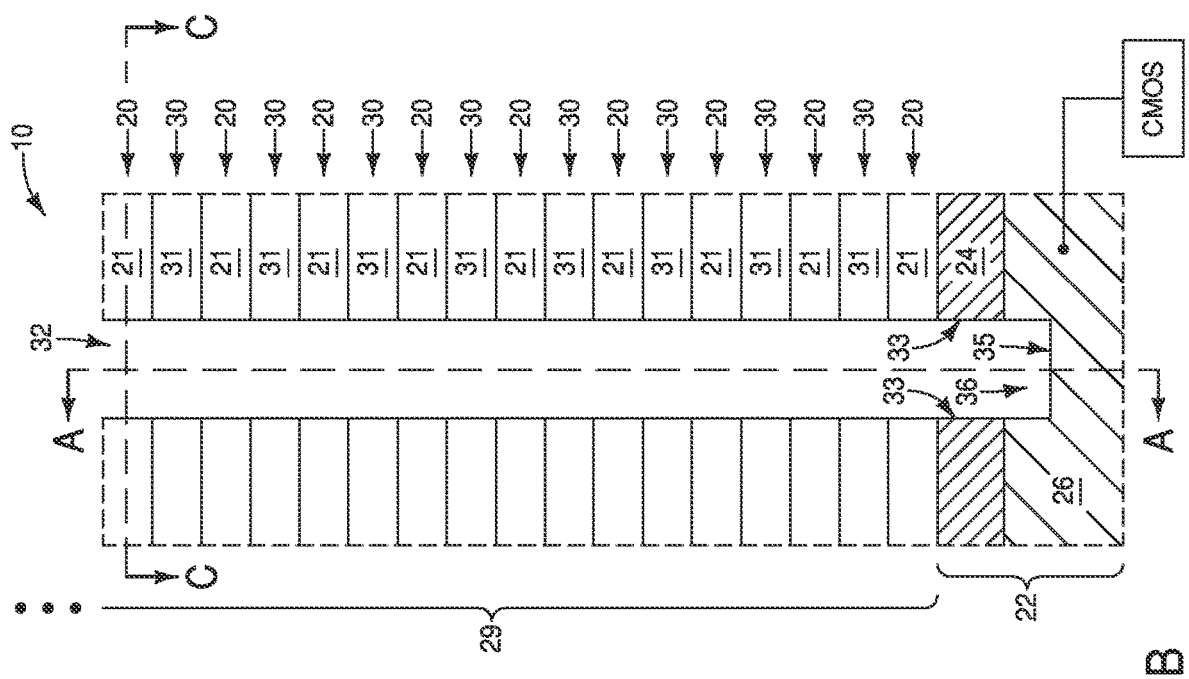

Referring to FIGS. 7-7B, trenches (slits, openings) 32 are formed through the stack 29 to the conductive structure 22. The slits 32 join to one another at intersect regions (T-regions) 34. The intersect regions are wider than other portions of the slits, and accordingly the etching utilized to form the slits may form cavities 36 in the semiconductor-containing material 24 at the intersect regions 34. At least one of the cavities 36 may extend through the semiconductor-containing material 24 to expose the metal-containing material 26 of the conductive structure 22. Additional cavities 36 may form at other locations besides the intersect regions, as shown in FIGS. 7A and 7B. Each of the illustrated cavities 36 may be considered to be a region of a trench 32 which passes through the semiconductor-containing material 24 and into the metal-containing material 26. In some embodiments, the cavities 36 may be considered to be bottom regions (or bottoms) of the trenches (or openings, slits, etc.) 32; with such bottom regions being illustrated to have exposed surfaces (or exposed regions) 33 of the semiconductor-containing material 24 and exposed surfaces (or exposed regions) 35 of the metal-containing material 26.

Figure 8:
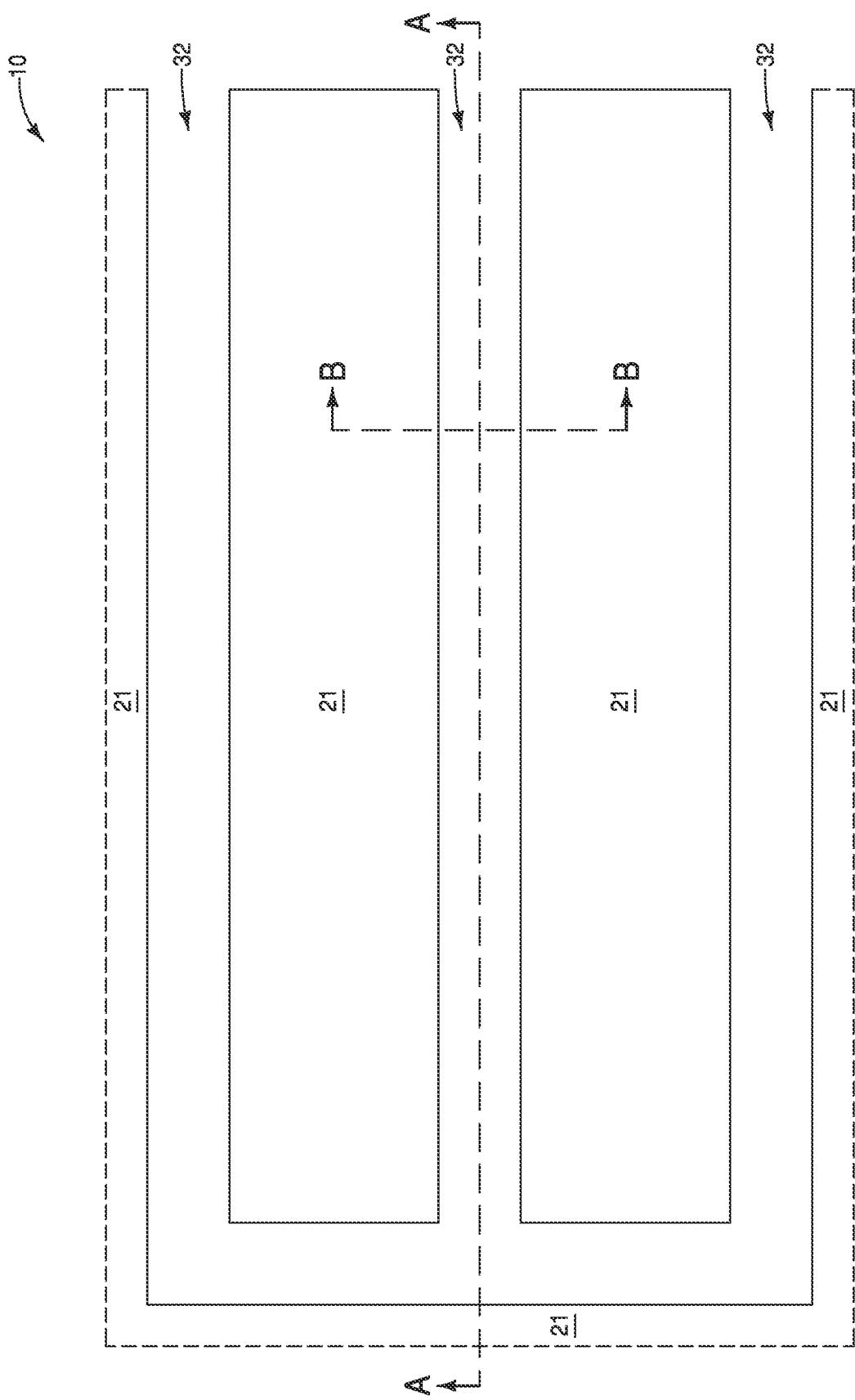
FIGS. 8-8B are views of the region of the integrated assembly of FIGS. 6-6B at an example process stage subsequent to the process stage of FIGS. 7-7B.
Figure 8B:
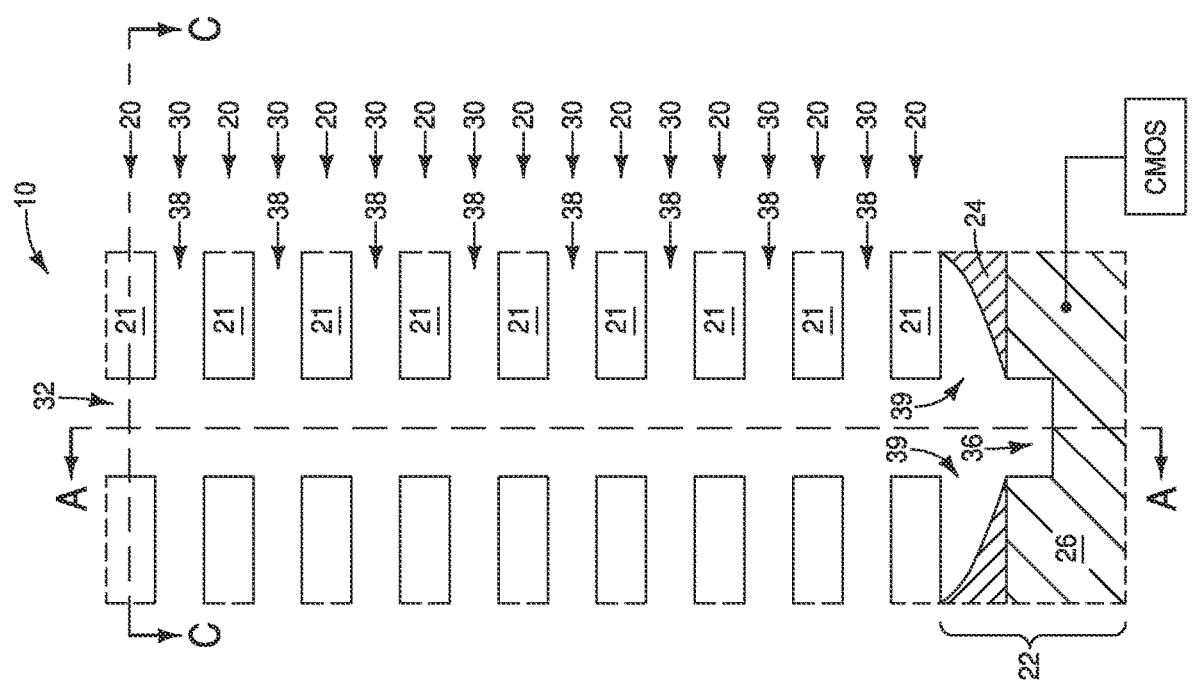

Referring to FIGS. 8-8B, the sacrificial material 31 (FIGS. 7-7B) is removed to form voids 38 along the levels 30. Such removal may utilize etching with hot phosphoric acid. The semiconductor-containing material 24 (e.g., conductively-doped silicon) would generally be resistant to the etching utilized to remove the sacrificial material 31. However, the exposure of conductive material 26 within the cavities 36 enables a galvanic reaction to occur (due to different oxidation potentials of the exposed materials 24 and 26) which undesirably removes some of the conductive material 24. The removal of the conductive material 24 leads to formation of voids (or cavities) 39 undercutting regions under the bottommost of the insulative levels 20.

The galvanic reaction is described as a possible mechanism for the undesired removal of regions of the semiconductor-containing material 24 to assist the reader in understanding the invention described herein. The actual mechanism underlying the removal of the regions of the semiconductor-containing material 24 may involve other reactions in addition to, or alternatively to, the galvanic reaction described herein. The claims that follow are not to be limited to any specific reaction mechanism described herein except to the extent, if any, that such reaction mechanism is specifically recited in the claims.

Figure 9:
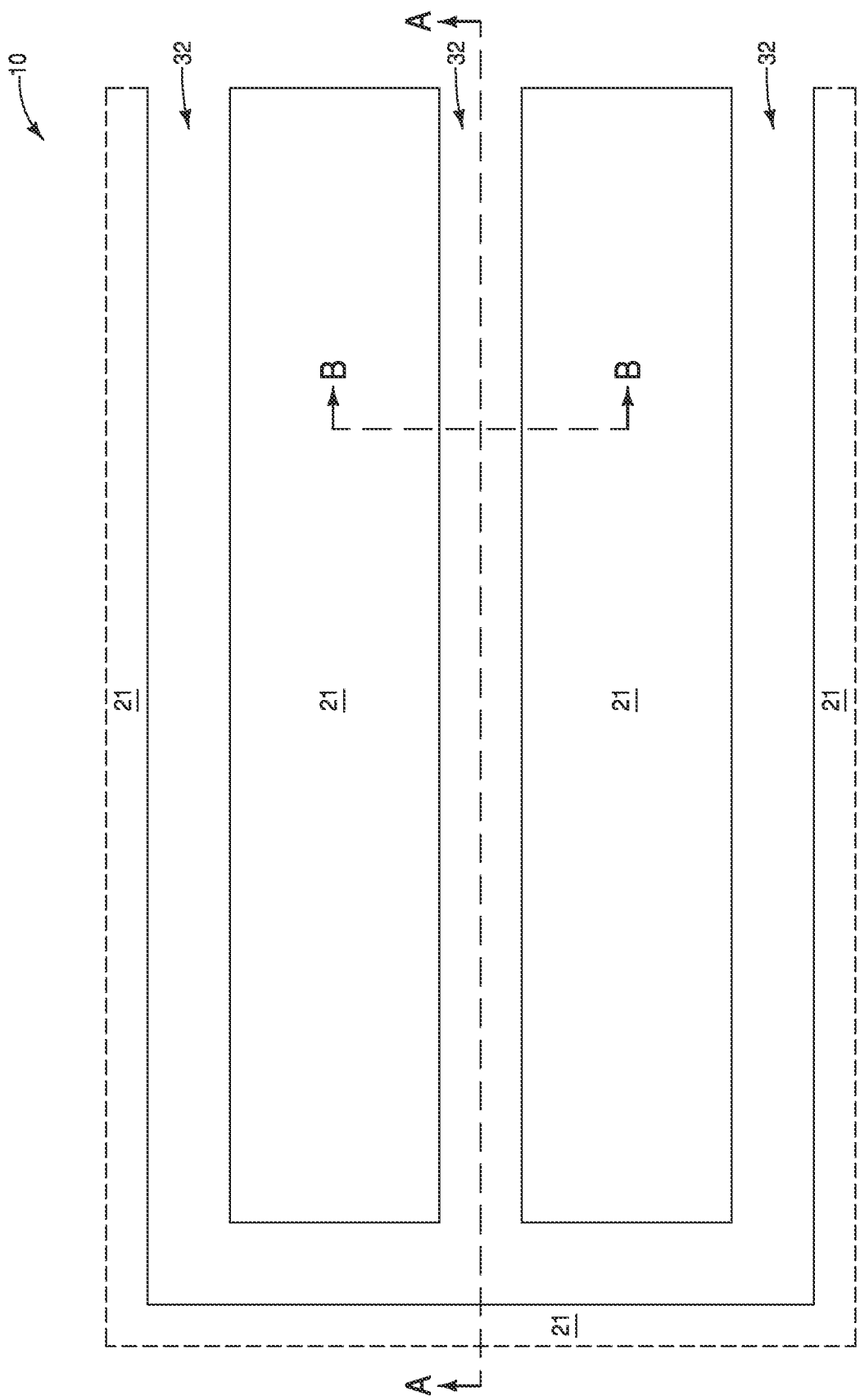
FIGS. 9-9B are views of the region of the integrated assembly of FIGS. 6-6B at an example process stage subsequent to the process stage of FIGS. 8-8B.
Figure 9B:
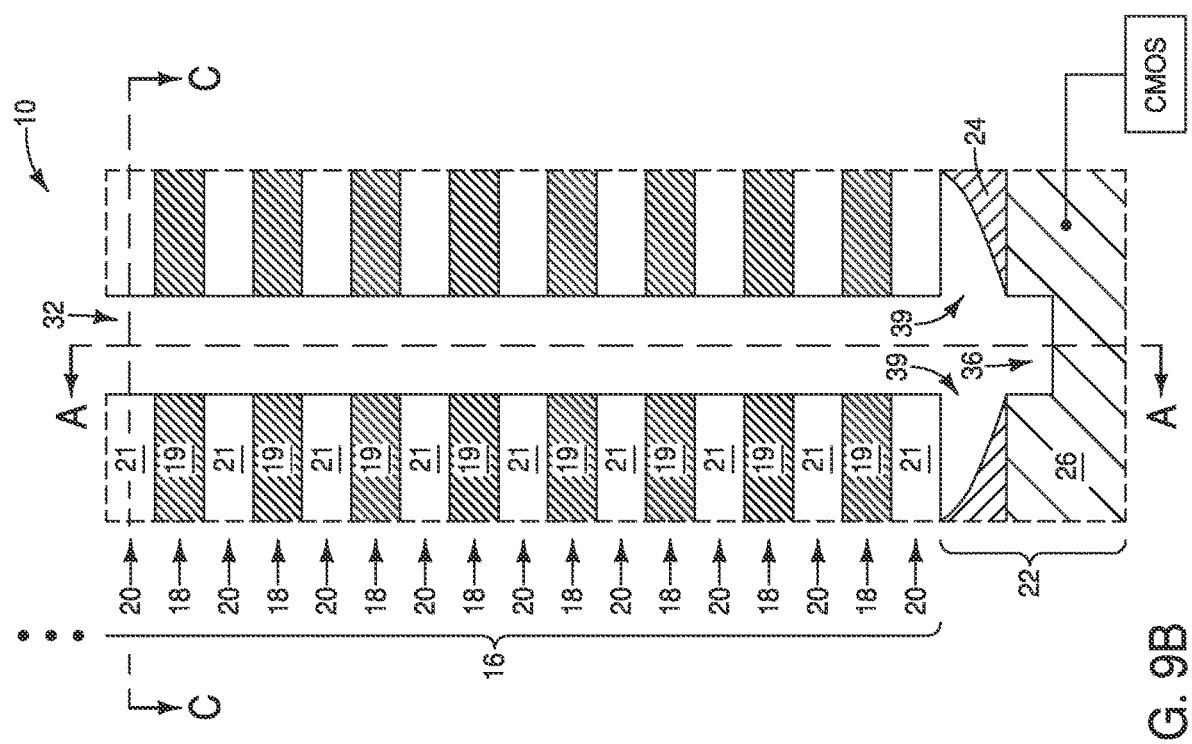

Referring to FIGS. 9-9B, the conductive material 19 is formed within the voids 30 (FIGS. 8-8B) to form the stack 16 described above with reference to FIGS. 5-5B. Such may be accomplished with any suitable processing. In some embodiments, the formation of the conductive material 19 within the voids 30 will comprise deposition of the conductive material 19, followed by suitable etching to remove excess conductive material 19 from within the slits 32. In subsequent processing, the insulative material 14 may be formed within the slits 32 to thereby form the partition 12 described above with reference to FIGS. 5-5B. Unfortunately, the voids 39 weaken the support under regions of the stack 16, which can problematically lead warping, collapse, etc., of regions of the stack 16.

Some embodiments include processing which may prevent the problems described with reference to FIGS. 6-9. An example method is described with reference to FIGS. 10-13.

Figure 10:
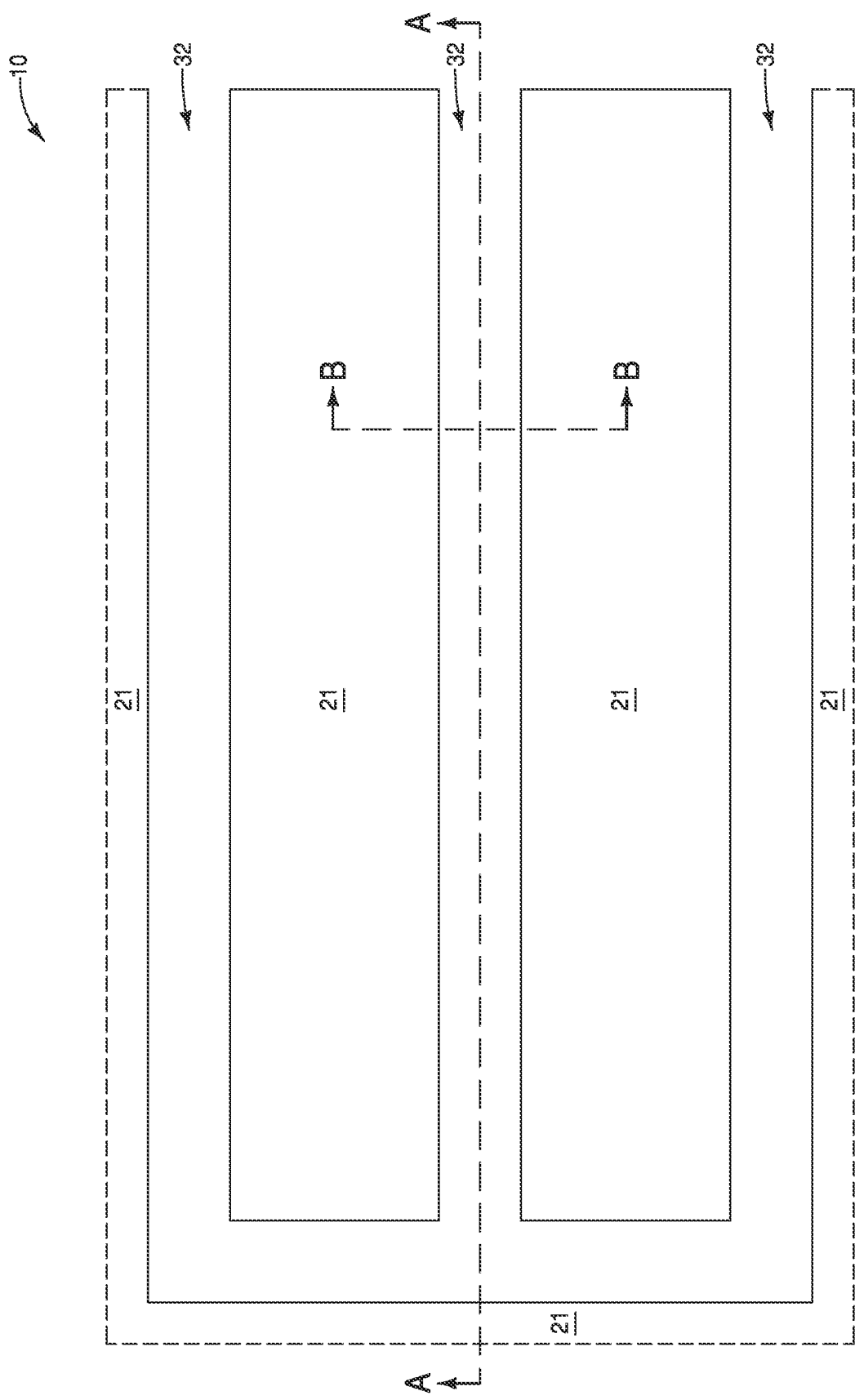
FIGS. 10-10B are views of the region of the integrated assembly of FIGS. 6-6B at an example process stage subsequent to the process stage of FIGS. 7-7B.
Figure 10A:
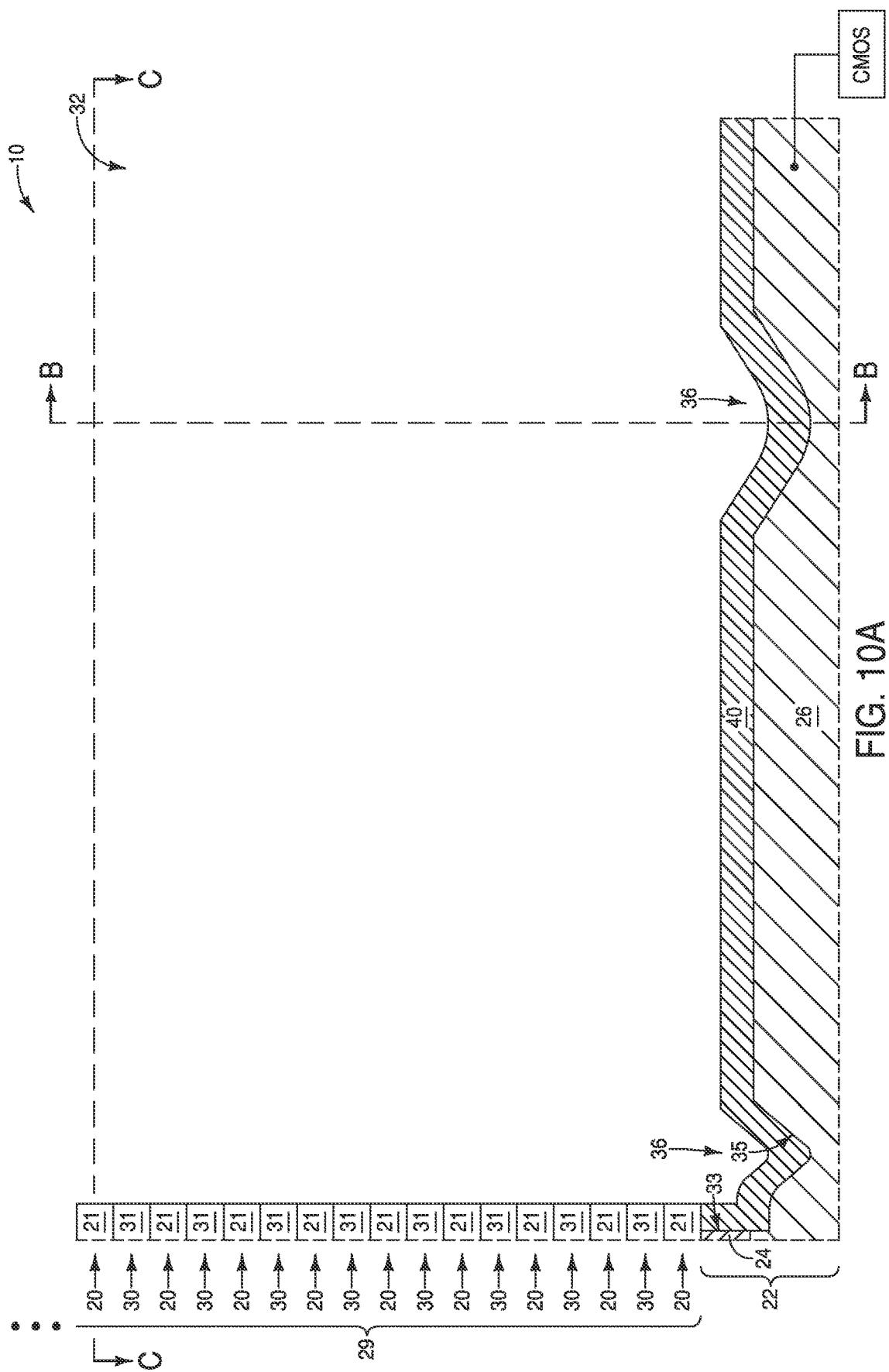
Figure 10B:
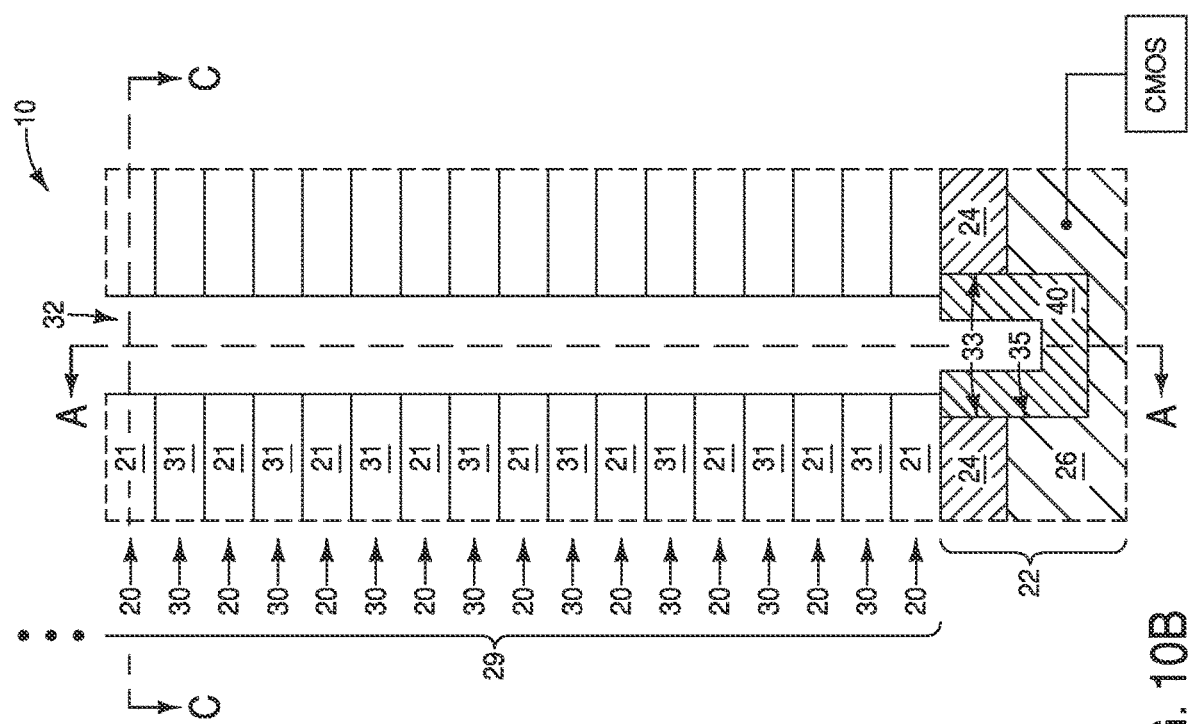

Referring to FIGS. 10-10B, construction 10 is shown at a processing stage which may follow the processing stage of FIGS. 7-7B. The construction of FIGS. 10-10B includes the stack 29 having the alternating first and second materials 21 and 31.

A conductive third material 40 is formed along the bottom of the trench (opening, slit, etc.) 32 to cover the surfaces 33 and 35 of the semiconductor-containing material 24 and the metal-containing material 26. The third material 40 thus becomes a single conductive composition along the bottom of the trench 32 which covers the multiple conductive compositions 24 and 26 of the conductive structure 22. In some embodiments, the conductive third material 40 may be considered to cover the conductive regions 24 and 26 of the conductive structure 22. In some embodiments, regions (surfaces) of the semiconductor-containing material 24 and the metal-containing material 26 may be considered to be converted into the conductive third material 40. In some embodiments, the conductive third material 40 may be considered to become part of the conductive structure 22.

The third material 40 may comprise any suitable conductive composition(s); and in some embodiments may comprise, consist essentially of, or consist of one or more of cobalt, molybdenum, nickel, ruthenium, tantalum, titanium and tungsten. The third material 40 may be formed utilizing one or more metal-halide precursors. For instance, in some embodiments the conductive material 40 may comprise, consist essentially of, or consist of tungsten, and may be formed utilizing a precursor comprising a tungsten halide (e.g., tungsten fluoride, $WF_6$). The precursor may be utilized under any suitable reaction conditions; and in some embodiments may be utilized at a temperature of at least about 300° C., and at a pressure of about atmospheric pressure.

The material 40 may be pure metal, or may comprise one or more non-metal constituents. In some embodiments, the material 40 may comprise one or more of boron, carbon, nitrogen, oxygen and silicon. Accordingly, one or more metals within the material 40 may be present as metal boride, metal carbide, metal nitride, metal silicide and/or metal oxide. The metal nitride may be formed by incorporating nitridizing (nitriding) species (e.g., $NH_3$) in combination with metal halide precursor during formation of the material 40. The metal oxide may be formed by incorporating oxidizing species (e.g., $O_2$ and/or $O_3$) in combination with metal halide precursor during formation of the material 40. The metal carbide may be formed by incorporating carbon-containing species (e.g., carbon halide) in combination with metal halide precursor during formation of the material 40. The metal boride may be formed by incorporating boron-containing species (e.g., $B_2H_6$) with metal halide precursor during formation of the material 40. The metal silicide may be formed by incorporating silicon-containing species (e.g., silane) in combination with metal halide precursor during formation of the material 40.

The material 40 may form a liner across exposed surfaces of the conductive materials 24 and 26 of the conductive structure 22. Alternatively, or additionally, at least some of the material 40 may intercalate into one or both of the materials 24 and 26 (e.g., at least some of the material 40 may result from lattice substitution within one or both of the materials 24 and 26). In either the case of the liner formation or the case of the intercalation, the exposed surfaces of structure 22 (the structure comprising the materials 24 and 26) may be considered to be converted from materials 24 and 26 into the material 40. In some embodiments, surfaces of one or both of materials 24 and 26 may be converted into the material 40.

The material 40 may be formed to any suitable thickness; and in some embodiments may be formed to a thickness within a range of from about 1 nm to about 700 nm.

Figure 11:
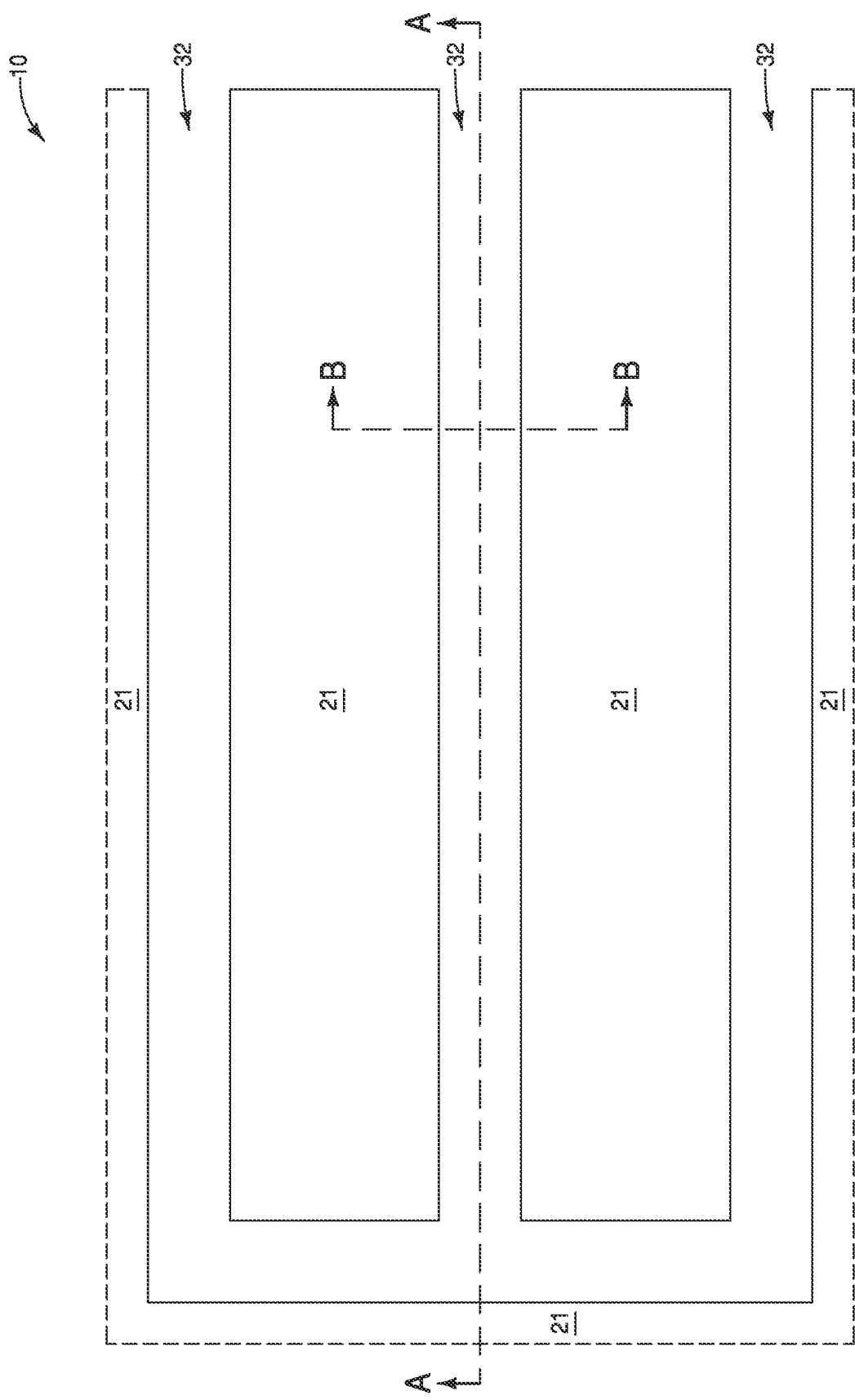
Figure 11A:
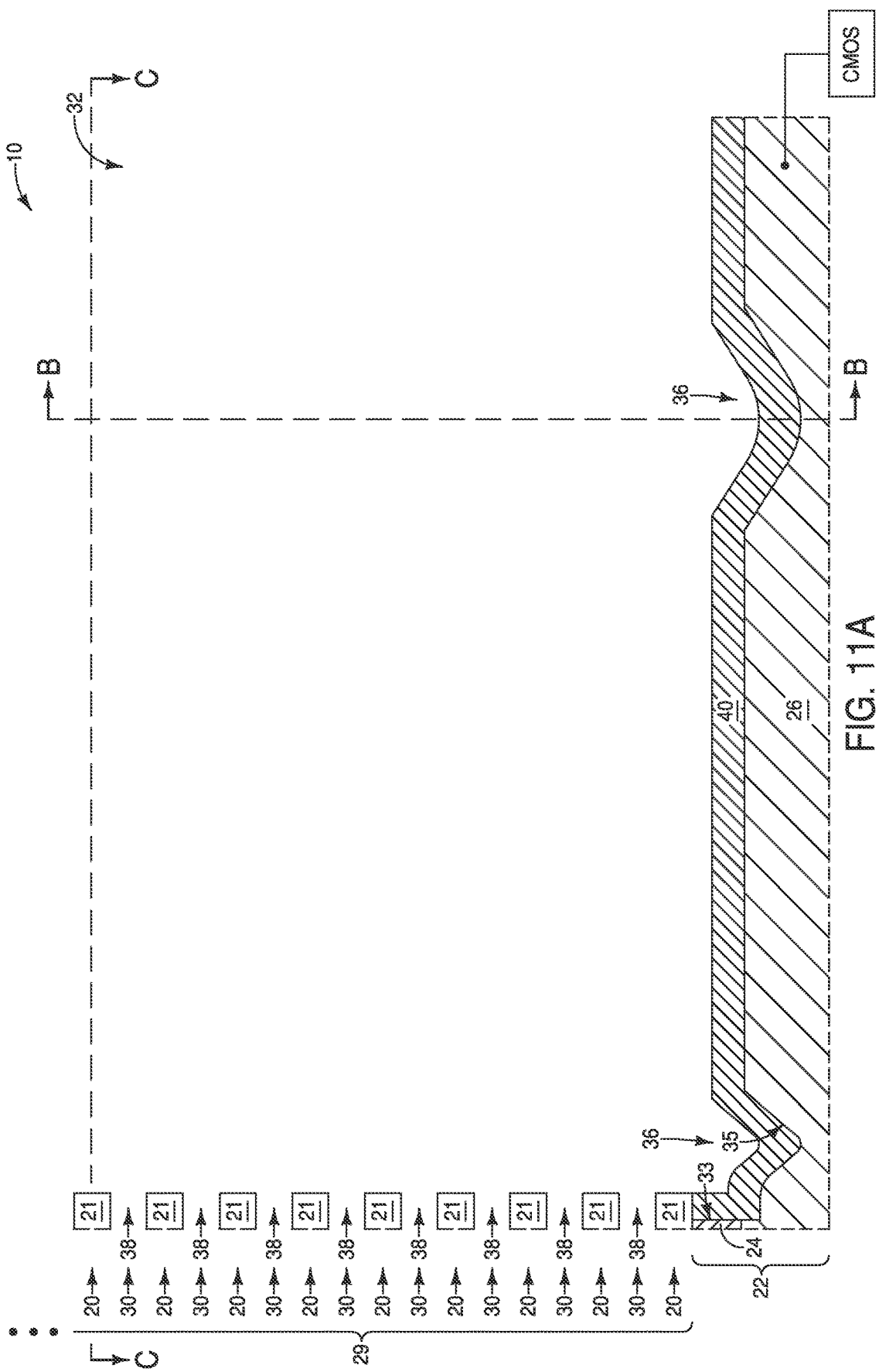

Referring to FIGS. 11-11B, the second material 31 (FIGS. 10-10B) is removed to form the voids 38 with processing analogous to that described above with reference to FIGS. 8-8B. In some embodiments, the material 31 may comprise silicon nitride, and may be removed with an etch utilizing hot phosphoric acid. Since the single conductive material 40 lines the bottoms of the trenches 32, the galvanic reaction described above with reference to FIGS. 8-8B is avoided. Accordingly, the problematic corrosion of the silicon-containing material 24 is avoided.

Figure 12:
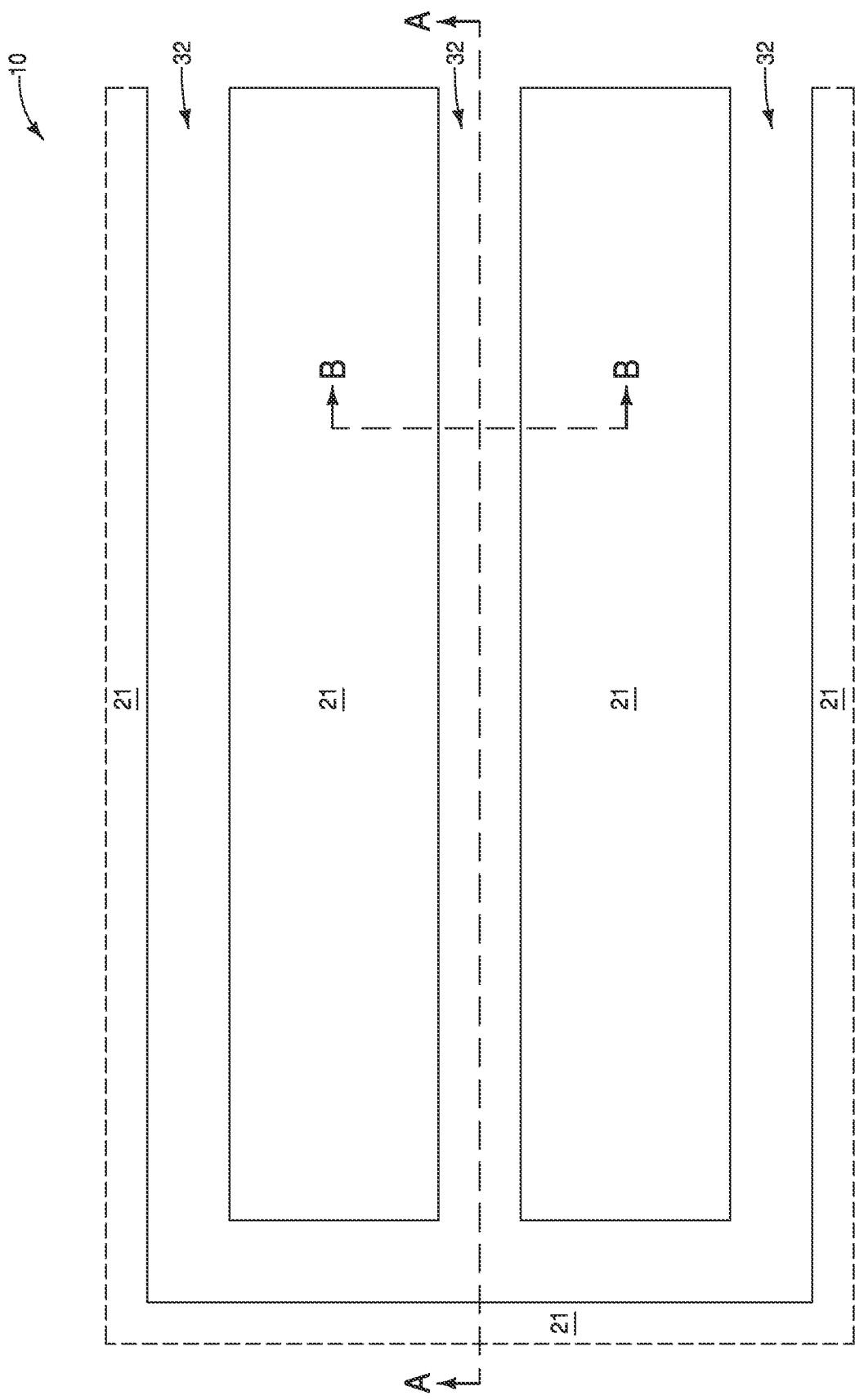
Figure 12A:
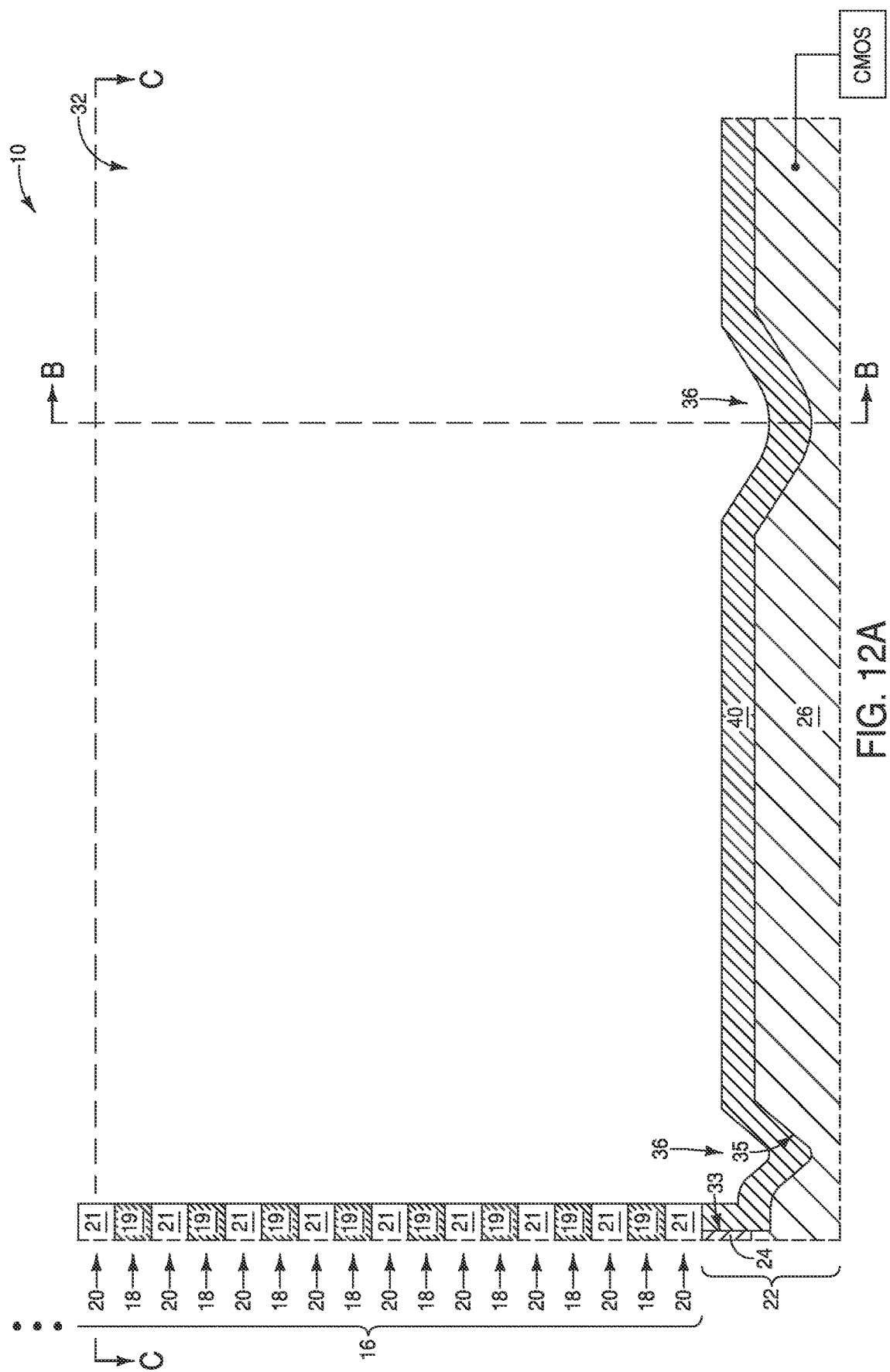

Referring to FIGS. 12-12B, the conductive material 19 is formed within the voids 30 (FIGS. 11-11B) to form the stack 16 described above with reference to FIGS. 5-5B. Although the voids 30 (FIGS. 11-11B) are shown to be filled only with conductive material, it is understood that at least some of the material formed in the voids may be insulative material (e.g., high-k dielectric material utilized as dielectric barrier material within NAND memory cells).

The conductive material 19 may form NAND wordline levels of a NAND assembly (e.g., NAND wordline levels of one or more of the NAND assemblies described above with reference to FIGS. 1-4).

Figure 13:
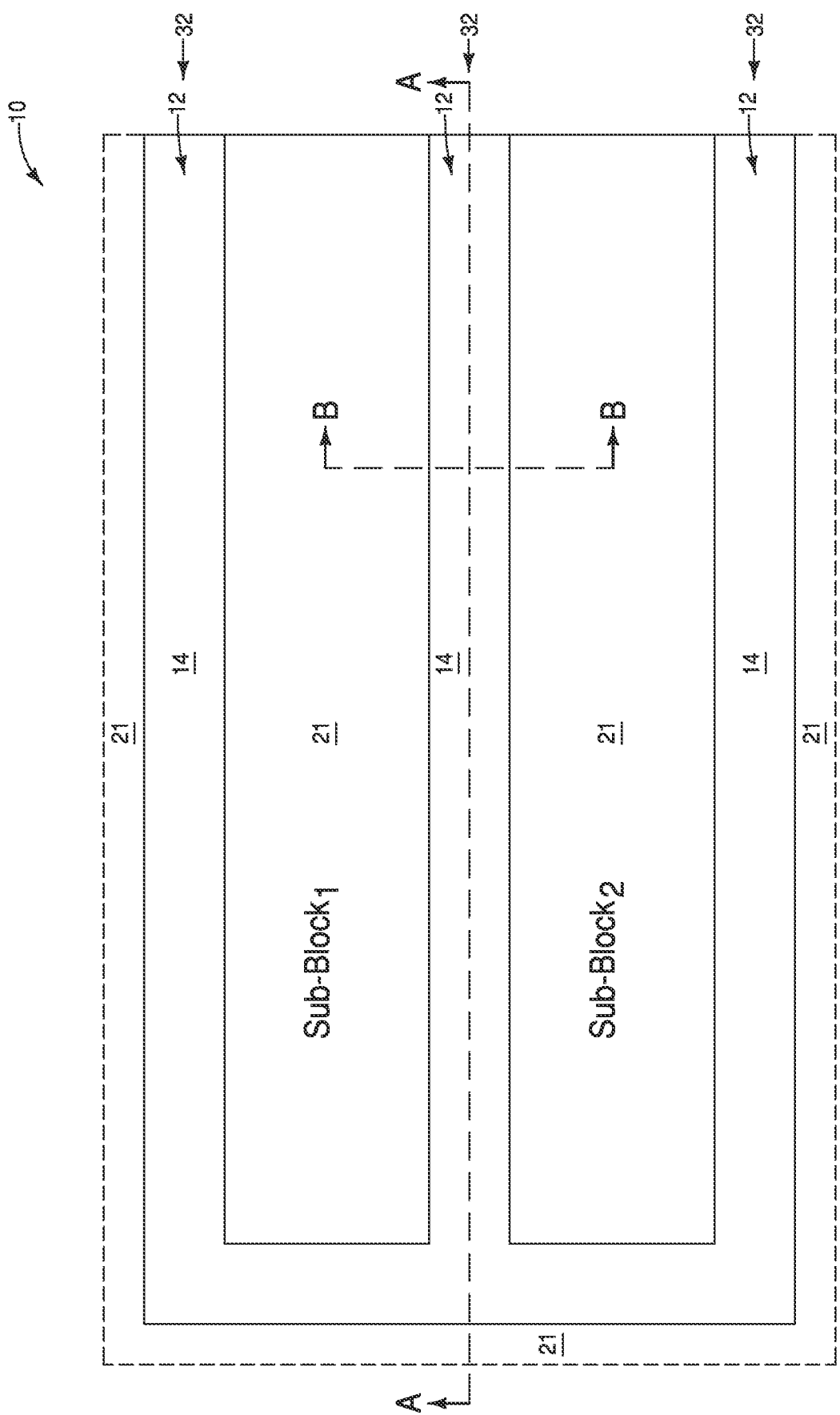
FIGS. 13-13B are views of the region of the integrated assembly of FIGS. 6-6B at an example process stage subsequent to the process stage of FIGS. 12-12B.
Figure 13A:
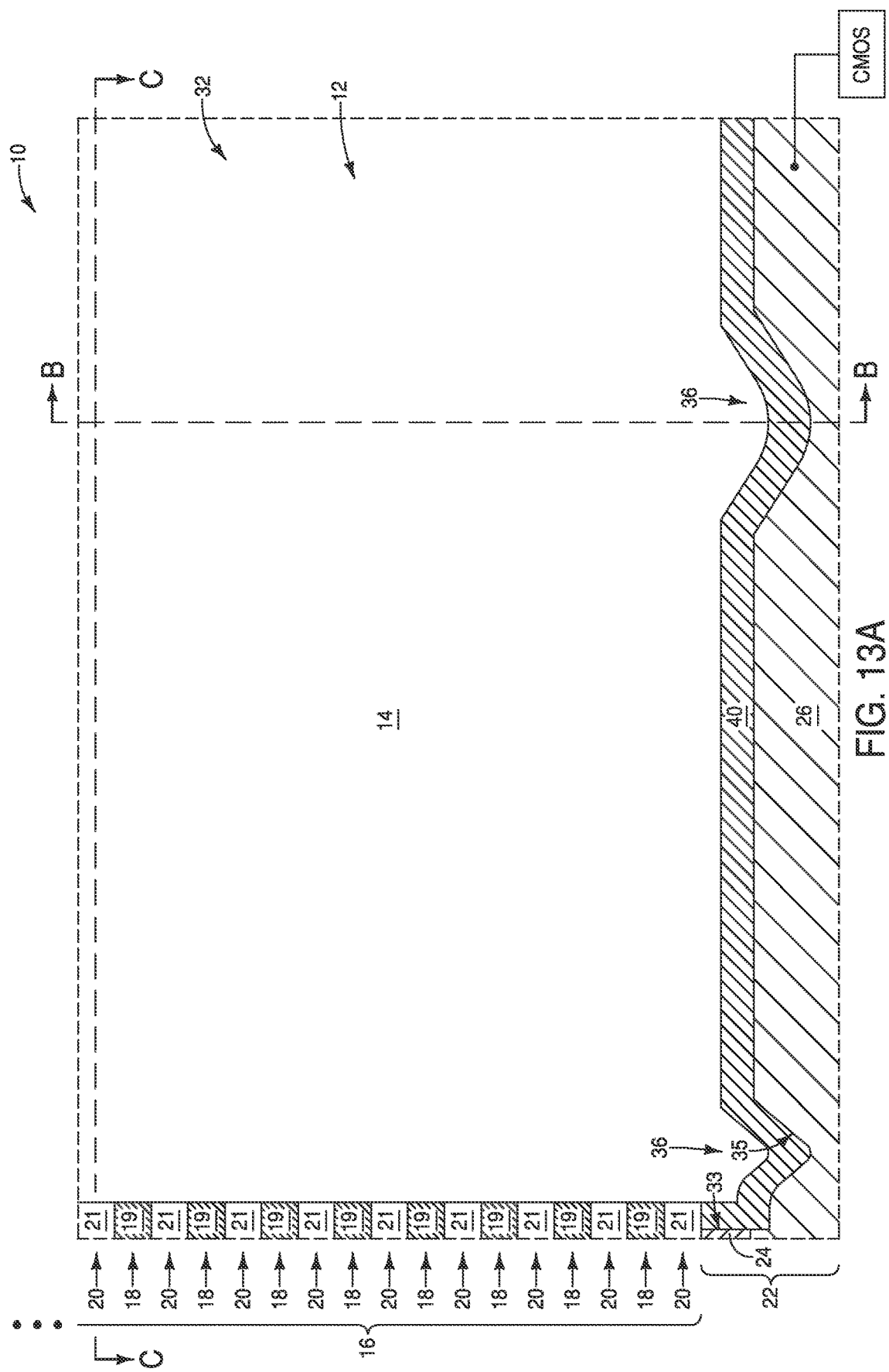
Figure 13B:
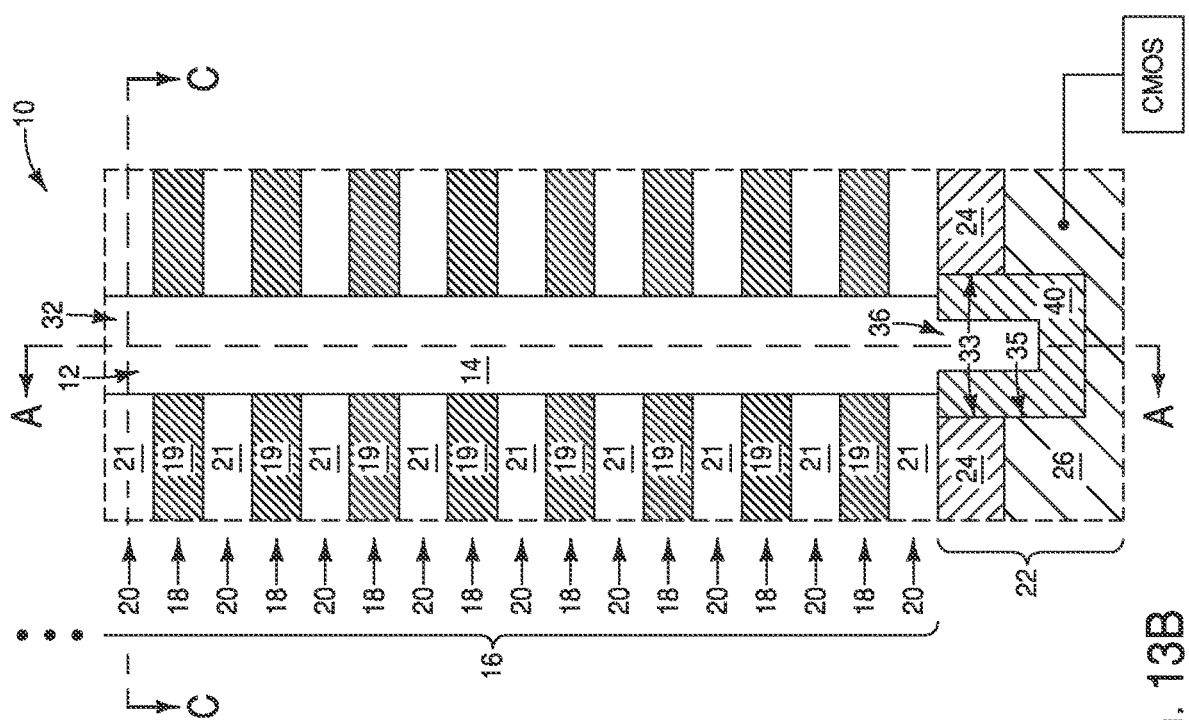

Referring to FIGS. 13-13B, the insulative partition material 14 is formed within the trenches 32 to form the partitions (panels) 12. In some embodiments the conductive material 19 forms wordline levels of a NAND assembly, and the partitions 12 divide the NAND assembly into sub-blocks.

In some embodiments, the assembly 10 of FIG. 13-13B may be considered to comprise the conductive structure 22 having the semiconductor-containing material 24 and the metal-containing material 26; with the metal-containing material 26 being referred to as a first metal-containing material. The trench 32 may be considered to extend into the conductive structure 22 (as shown in FIGS. 13A and 13B), with a bottom region of the trench being lined with the second metal-containing material 40. The second metal-containing material 40 is compositionally different than the first metal-containing material 26; and directly contacts the conductive materials 24 and 26 of the conductive structure 22. The stack 16 of alternating conductive levels 18 and insulative levels 20 is over the conductive structure 22. The partition 12 is within the trench 32 and extends through the stack 16. The partition 12 directly contacts the metal-containing material 40, and is spaced from the materials 24 and 26 by the metal-containing material 40.

Additional example embodiments are described with reference to FIGS. 14-19.

Figure 14:
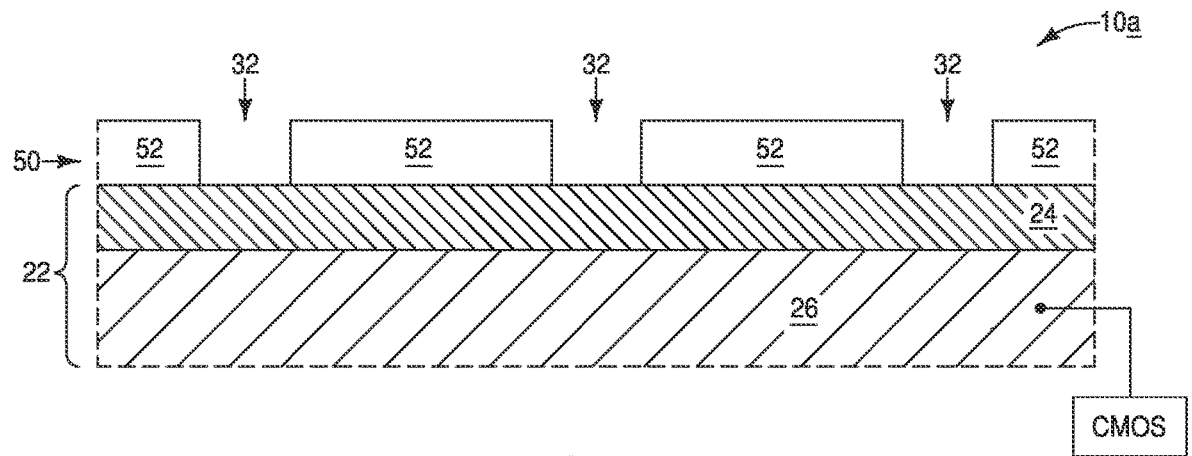
FIGS. 14-18 are diagrammatic cross-sectional side views of an integrated assembly at sequential process stages of an example method.

Referring to FIG. 14, an integrated assembly 10a includes the conductive structure 22 described above. The conductive structure 22 may be a NAND source structure, and is shown to be electrically coupled with CMOS circuitry. The conductive structure 22 includes the semiconductor-containing material 24 over the metal-containing material 26.

A patterned mask 50 is over the semiconductor-containing material 24 of the conductive structure 22. The mask 50 comprises masking material 52. The masking material 52 may include any suitable composition(s); and in some embodiments may comprise silicon dioxide, either alone, or in combination with photolithographically-patterned photoresist and/or other suitable masking materials.

The patterned mask 50 defines regions for the openings 32.

Figure 15:
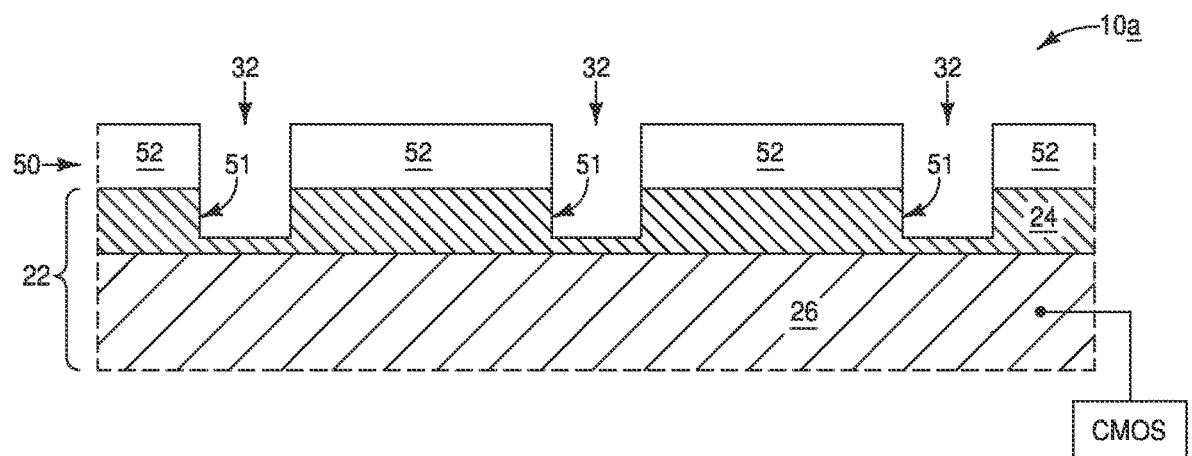

Referring to FIG. 15, the openings 32 are extended into the conductive structure 22. The openings 32 may extend into only the semiconductor-containing material 24 (as shown in FIG. 15), or may extend into both of the materials 24 and 26 (as shown in FIG. 7B). The openings 32 have peripheries 51 which include regions of the semiconductor-containing material 24 (in the embodiment of FIG. 15) and possibly also regions of the metal-containing material 26 (in the embodiment of FIG. 7B).

Figure 16:
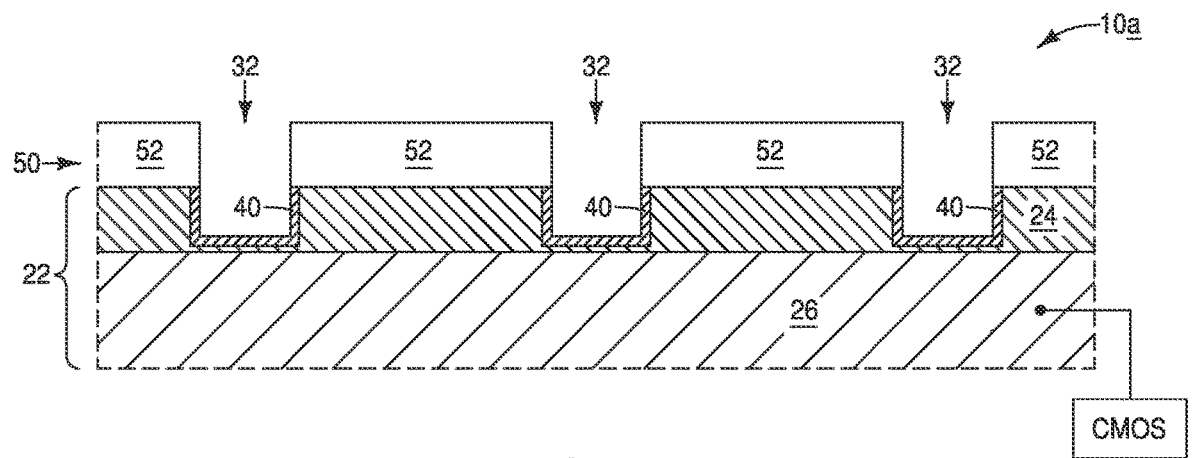

Referring to FIG. 16, the conductive material 40 is formed to cover the exposed regions of the semiconductor-containing material 24 along the peripheries 51 (labeled in FIG. 15) of the openings 32. The mask 50 protects upper surfaces of the semiconductor-containing material 24 from being exposed to the conditions which form the conductive material 40.

Figure 17:
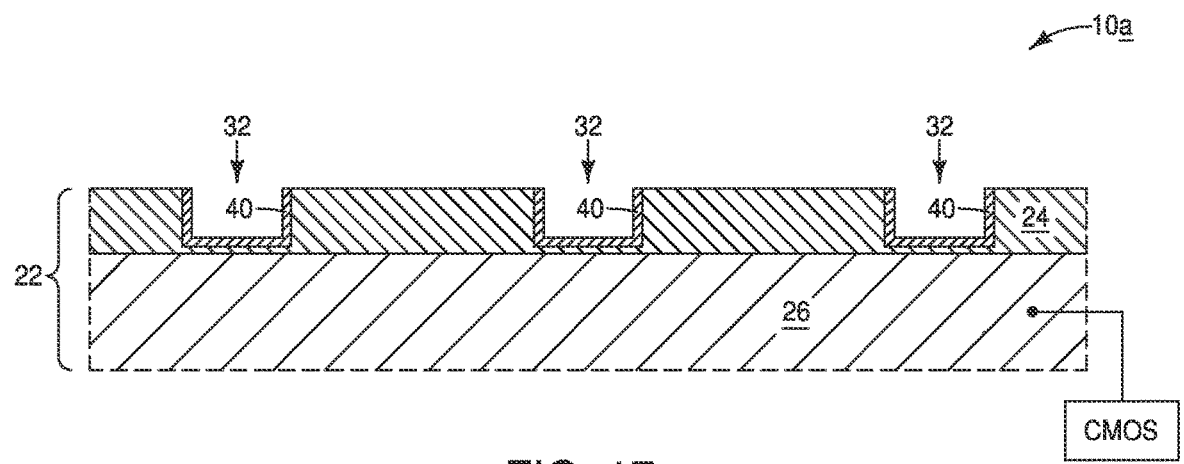

Referring to FIG. 17, the mask 50 is removed.

Figure 18:
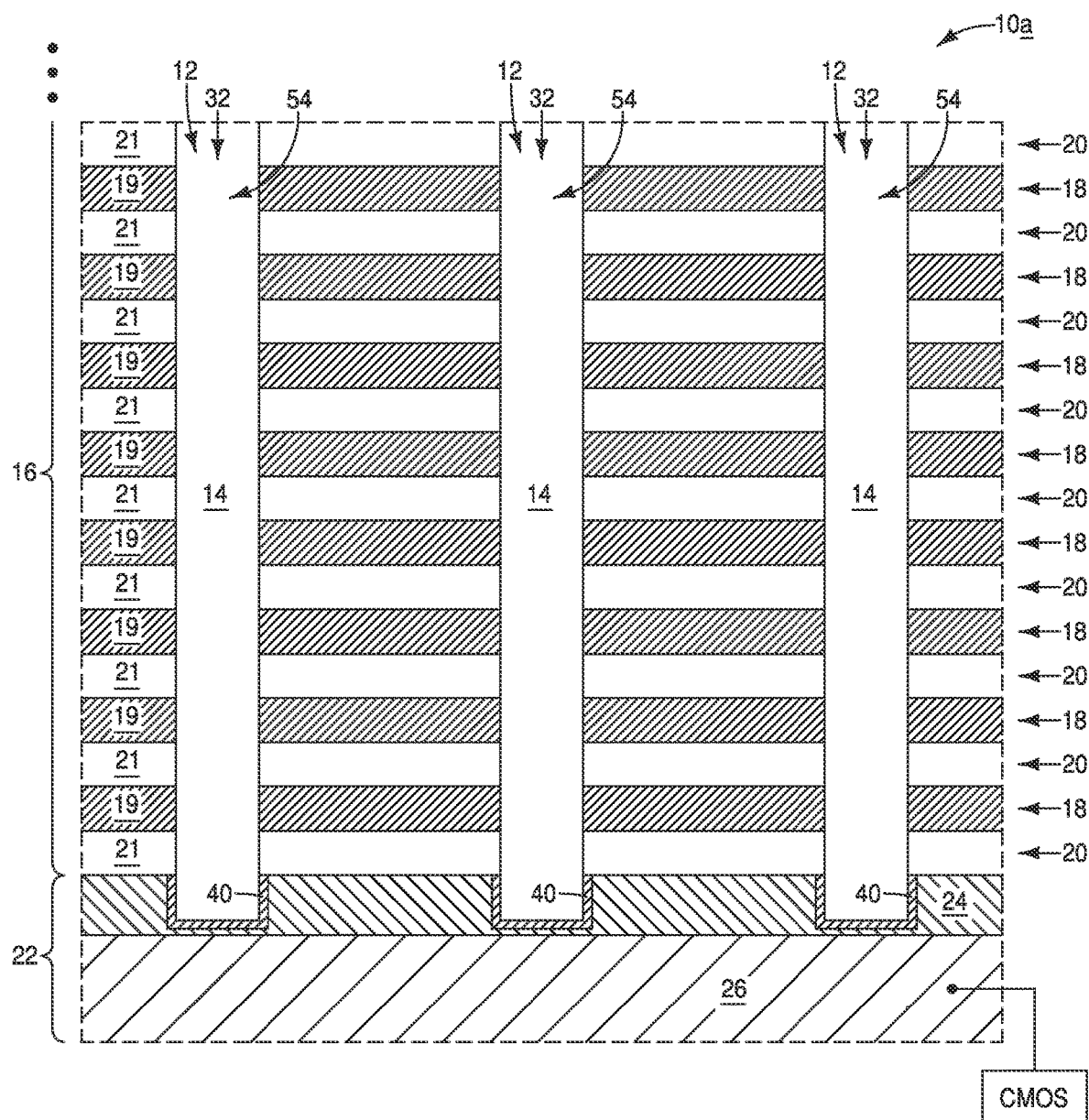

Referring to FIG. 18, the stack 16 is formed over the conductive structure 22. The insulative material 14 of the panels 12 is formed within the openings 32 (FIG. 17), to form a construction analogous to that described above with reference to FIG. 13B. However, in the embodiment of FIGS. 14-18, the openings are formed within the conductive structure 22 prior to forming a stack over the conductive structure, whereas in the embodiment described previously (with reference to FIGS. 10-13) the openings are formed after forming the stack 29 over the conductive structure 22.

The openings 32 utilized to form the configuration of FIG. 18 may be trenches extending in and out of the page relative to the cross-sectional views of FIGS. 14-18 so that the structures 12 are configured as panels extending in and out of the page relative to the cross-sectional view of FIG. 18. Each panel 12 may separate one NAND sub-block on one side of the panel from another NAND sub-block on an opposing side of the panel analogous to the configurations described above with reference to FIGS. 5-13.

The conductive material 40 of FIG. 18 may be considered to be a second metal-containing material which is different from the first metal-containing material 26, and which directly contacts the semiconductor-containing material 24. The panels 12 may be considered to be formed within the openings 32 that extend through the stack 16. The panels 12 extend partially into the conductive material 22, with bottom regions of such openings being aligned with the conductive material 40.

In some embodiments, the panels 12 may be considered to be examples of vertical structures 54 which are within the openings 32, and which directly contact the conductive material 40. Bottom regions of the structures 54 are spaced from the semiconductor-containing material 24 by the conductive material 40. The conductive material 40 may be considered to form conductive rails along the bottom regions of the panels 12.

Figure 19:
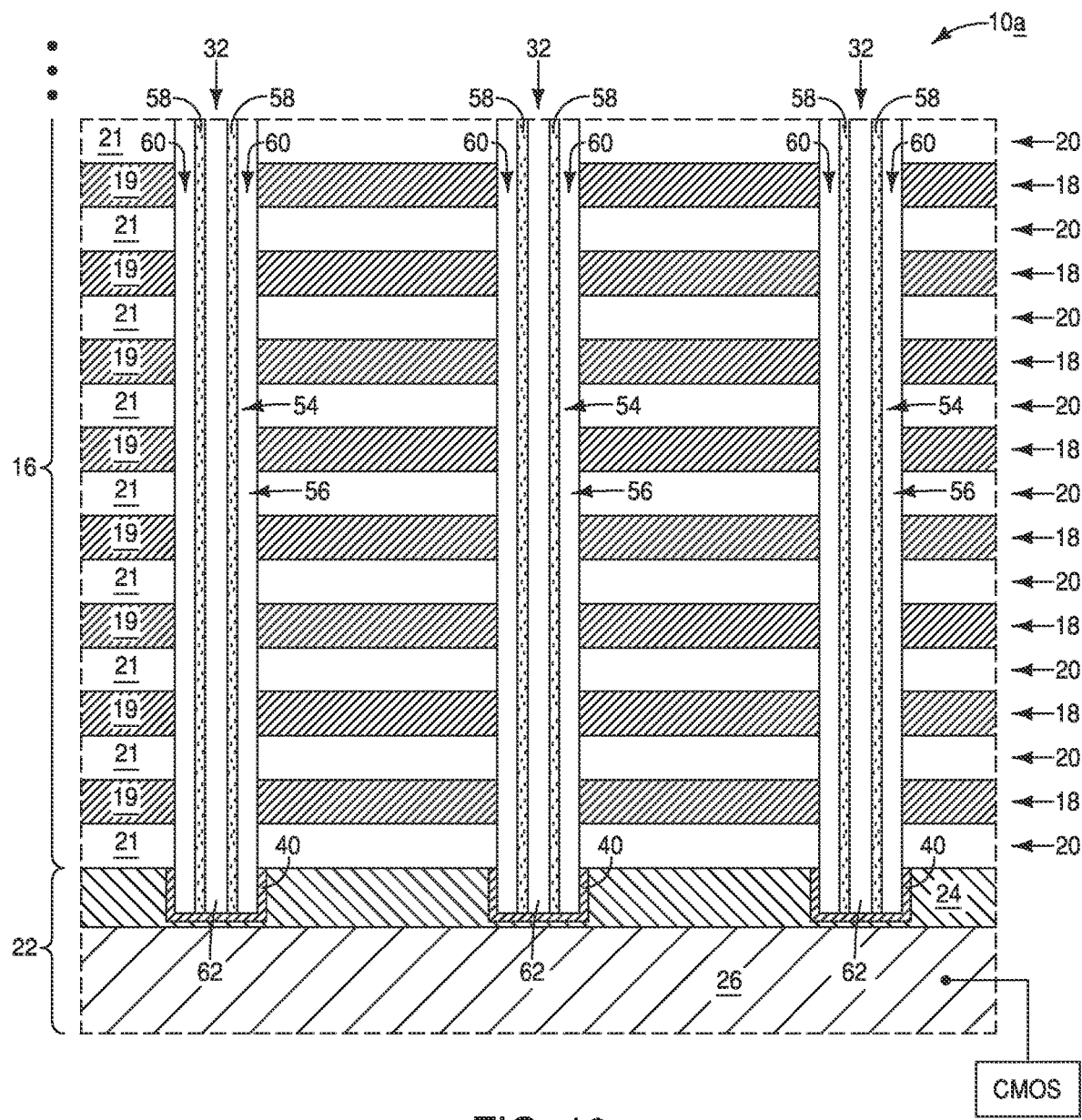
FIG. 19 is a diagrammatic cross-sectional side view of the integrated assembly of FIG. 14 shown at an example process stage which may follow the process stage of FIG. 17.
Figure 19A:
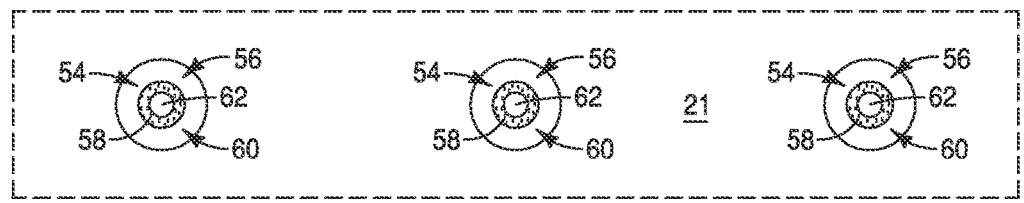
FIG. 19A is a diagrammatic top view of a region of the integrated assembly of FIG. 19.

In some embodiments, the openings 32 of FIGS. 14-17 may be suitable for forming channel-material pillars of a NAND assembly; or in other words, may be suitable for forming NAND channel structures (regions) of a NAND assembly. In such embodiments, the openings may be circular, elliptical, etc., when viewed from above. For instance, FIGS. 19 and 19A show regions of the construction 10a at a processing stage analogous to that of FIG. 18, but in a configuration in which channel-material pillars 56 are formed within the openings 32. The pillars 56 comprises channel material 58. The channel material 58 may be appropriately-doped semiconductor material (or semiconductor-containing material), and in some embodiments may comprise silicon. The channel material 58 is spaced from the materials 19 and 21 of the stack 16 by regions 60. Such regions may include one or more of dielectric-barrier material, charge-blocking material, charge-storage material and gate dielectric material (i.e., tunneling material). The channel material structures may be considered to be additional examples of vertical structures 54 which are formed within the openings 32, and which directly contact the conductive material 40.

The illustrated channel-material structures 56 are hollow channel configurations, with the channel material 58 laterally surrounding insulative material 62. The insulative material 62 may comprise any suitable composition(s); and in some embodiments may comprise silicon dioxide. In other embodiments (not shown) the channel-material structures 56 may be solid pillars.

In the shown embodiment, the channel material 58 directly contacts the conductive material 40. The conductive material 40 may provide a uniform high-conductivity connection between the channel material 58 and the conductive structure 22. For instance, in some embodiments the material 40 may comprise, consist essentially of, or consist of tungsten. The conductive material 40 may provide improved conductivity (i.e., lowered resistance) of a connection between the channel material 58 and the conductive structure 22. Such may enable additional materials to be utilized instead of, or in addition to, the materials 24 and 26 of the source structure 22 (i.e., may expand the window of suitable materials for the source structure 22), and may further enable a wider range of thicknesses to be utilized for the materials of the source structure 22 than is suitable with lower-conductivity connections to the source material. For instance, source resistance may be a problem with conventional source configurations, which leads to a requirement for thicker source materials, and/or to a limited selection of source materials. The conductive structures 40 may improve conductivity, and thus may enable thinner source materials to be utilized, and/or may enable a wider selection of source materials to be utilized. Also, the material 40 may provide corrosion resistance (particularly if the openings 32 extend into both of the materials 24 and 26 of the conductive structure 22) for reasons analogous to those described above with reference to FIGS. 5-13.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated assembly. A conductive structure is formed to comprise a semiconductor-containing material over a metal-containing material. An opening is formed to extend into the conductive structure. A periphery of the opening comprises a region of the semiconductor-containing material. A conductive material is formed to cover the region of the semiconductor-containing material.

Some embodiments include a method of forming an integrated assembly. A stack of alternating first and second materials is formed over a conductive structure. The conductive structure includes a semiconductor-containing material over a metal-containing material. An opening is formed to extend through the stack, through the semiconductor-containing material and into the metal-containing material. A bottom of the opening includes regions of the semiconductor-containing material and the metal-containing material. A third material is formed along the bottom of the opening to cover the regions of the semiconductor-containing material and the metal-containing material. The second material of the stack is removed to form voids. Conductive material is formed within the voids. Insulative material is formed within the opening.

Some embodiments include a method of forming an integrated assembly. A stack of alternating first and second materials is formed over a conductive structure. The conductive structure comprises a semiconductor-containing material over a metal-containing material. A trench is formed to extend through the stack. At least some regions of the trench pass through the semiconductor-containing material and into the metal-containing material. Bottom regions of the trench are lined with a third material. The third material is a different composition than the metal-containing material, and comprises one or more of cobalt, molybdenum, nickel, ruthenium, tantalum, titanium and tungsten. The second material of the stack is removed to form voids. Conductive material is formed within the voids. The conductive material forms conductive levels of a NAND assembly. An insulative partition is formed within the trench. The insulative partition divides the NAND assembly into sub-blocks.

Some embodiments include an integrated assembly having a conductive structure. The conductive structure comprises a semiconductor-containing material over a first metal-containing material. An opening extends into the conductive structure. A bottom region of the opening is lined with a second metal-containing material which is of a different composition relative to the first metal-containing material. The second metal-containing material directly contacts the semiconductor-containing material. A stack of alternating conductive levels and insulative levels is over the conductive structure. A vertical structure is within the opening and extends through the stack. The vertical structure directly contacts the second metal-containing material, and is spaced from the semiconductor-containing material by the second metal-containing material.

Some embodiments include an integrated assembly having a conductive structure which includes a semiconductor-containing material over a first metal-containing material. A trench extends into the conductive structure. A bottom region of the trench is lined with a second metal-containing material which is of a different composition relative to the first metal-containing material. The second metal-containing material directly contacts both the first metal-containing material and the semiconductor-containing material. A stack of alternating conductive levels and insulative levels is over the conductive structure. A partition is within the trench and extends through the stack. The partition directly contacts the second metal-containing material, and is spaced from the semiconductor-containing material and the first metal-containing material by the second metal-containing material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
    a conductive structure comprising a semiconductor-containing material over a first metal-containing material;
    an opening extending into the conductive structure; a bottom region of the opening being lined with a second metal-containing material which is of a different composition relative to the first metal-containing material; the second metal-containing material directly contacting the semiconductor-containing material and the first metal-containing material;
    a stack of alternating conductive levels and insulative levels over the conductive structure; and
    a vertical structure within the opening and extending through the stack; the vertical structure directly contacting the second metal-containing material, and being spaced from the semiconductor-containing material by the second metal-containing material.

2. The integrated assembly of claim 1 wherein the second metal-containing material covers surfaces of the first metal-containing material and the semiconductor-containing material.

3. The integrated assembly of claim 1 wherein the vertical structure is a NAND channel structure.

4. The integrated assembly of claim 1 wherein the vertical structure is an insulative panel spacing NAND sub-blocks from one another.

5. The integrated assembly of claim 1 wherein the first metal-containing material comprises $WSi_x$, where x is greater than 0; and wherein the second metal-containing material consists of one or more of cobalt, molybdenum, nickel, ruthenium, tantalum, titanium and tungsten.

6. An integrated assembly, comprising:
    a conductive structure comprising a semiconductor-containing material over a first metal-containing material;
    a trench extending into the conductive structure; a bottom region of the trench being lined with a second metal-containing material which is of a different composition relative to the first metal-containing material; the second metal-containing material directly contacting both the first metal-containing material and the semiconductor-containing material;
    a stack of alternating conductive levels and insulative levels over the conductive structure; and
    a partition within the trench and extending through the stack; the partition directly contacting the second metal-containing material, and being spaced from the semiconductor-containing material and the first metal-containing material by the second metal-containing material.

7. The integrated assembly of claim 6 wherein the first metal-containing material comprises $WSi_x$, where x is greater than 0; and wherein the second metal-containing material consists of one or more of cobalt, molybdenum, nickel, ruthenium, tantalum, titanium and tungsten.

8. The integrated assembly of claim 7 wherein the semiconductor-containing material comprises conductively-doped silicon.

9. The integrated assembly of claim 6 wherein the conductive levels of the stack are control gate levels of a NAND assembly.

10. The integrated assembly of claim 9 wherein the partition divides the NAND assembly into sub-blocks.

11. The integrated assembly of claim 6 wherein the insulative levels of the stack comprise silicon dioxide.

12. The integrated assembly of claim 6 wherein the second metal-containing material has a thickness within a range of from about 1 nm to about 700 nm.

13. The integrated assembly of claim 6 wherein the partition comprises silicon dioxide.

* * * * *